(12) United States Patent
Kato

(10) Patent No.: US 7,898,016 B2
(45) Date of Patent: Mar. 1, 2011

(54) CMOS SEMICONDUCTOR NON-VOLATILE MEMORY DEVICE

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 424 days.

(21) Appl. No.: 11/998,621

(22) Filed: Nov. 30, 2007

(65) Prior Publication Data

US 2008/0128787 A1    Jun. 5, 2008

(30) Foreign Application Priority Data

Nov. 30, 2006  (JP) ................. 2006-324335
Nov. 8, 2007   (JP) ................. 2007-290699

(51) Int. Cl.
*H01L 29/788* (2006.01)
(52) U.S. Cl. ............... 257/315; 257/E21.422; 257/324
(58) Field of Classification Search ............. 257/314, 257/315, E21.422; 365/184, 183
See application file for complete search history.

(56) References Cited

U.S. PATENT DOCUMENTS

| 7,368,788 B2 * | 5/2008 | Huo et al. ............ 257/351 |
| 2006/0097306 A1 * | 5/2006 | Kim et al. ............ 257/315 |
| 2006/0145240 A1 * | 7/2006 | Park et al. ............ 257/315 |

FOREIGN PATENT DOCUMENTS

| JP | 2005-322830 A | 11/2005 |
| JP | 2005-327796 A | 11/2005 |
| JP | 2006-186300 A | 7/2006 |
| WO | WO2004-084314 A | 9/2004 |

OTHER PUBLICATIONS

T. Sakai et al., Separation by Bonding Si Islands (SBSI) for LSI Applications, Second International SiGe Technology and Device Meeting, Meeting Abstract, May 2004, pp. 230-231.

* cited by examiner

*Primary Examiner* — Jerome Jackson, Jr.
*Assistant Examiner* — Paul A Budd
(74) *Attorney, Agent, or Firm* — AdvantEdge Law Group, LLC

(57) ABSTRACT

A semiconductor device includes a substrate, a first insulating film, a first semiconductor layer disposed above the substrate with the first insulating film therebetween, a second semiconductor layer disposed above the first semiconductor layer with a second insulating film therebetween, a first conductivity type metal oxide semiconductor (MOS) disposed on at least one side surface of the first semiconductor layer, a second conductivity type MOS disposed on at least one side surface of the second semiconductor layer, a charge storage layer common to the first and second MOS transistors, and a control gate common to the first and second MOS transistors. The common charge storage layer is continuously provided from the side surface of the first semiconductor layer on which the first conductivity type MOS transistor is disposed to the side surface of the second semiconductor layer on which the second conductivity type MOS transistor is disposed.

3 Claims, 24 Drawing Sheets

CMOS SEMICONDUCTOR NON-VOLATILE MEMORY DEVICE

TECHNICAL FIELD

Several aspects of the present invention relate to a semiconductor device and a manufacturing method thereof. In particular, the invention relates to a technology that enables read of data and write and deletion of data at a low voltage.

RELATED ART

As disclosed in JP-A-2006-186300 and International Publication Pamphlet No. 2004/084314, related-art non-volatile memories have a planar metal-oxide-semiconductor (MOS) structure and include a floating gate formed between a control gate and a silicon substrate (metal oxide semiconductor field effect transistor (MOSFET) channel) and surrounded by $SiO_2$ insulating films. In a non-volatile memory thus structured, data is written by applying a large positive voltage of several tens of volts to the source/drain or body via a control gate and implanting electrons to a floating gate. Data is deleted by applying a negative voltage of several tens of volts to the source/drain or body via the control gate and extracting the electrons from the floating gate. See other related-art examples: JP-A-2005-327796, JP-A-2005-322830, and T. Sakai et al. "Separation by Bonding Si Islands (SBSI) for LSI Application," Second International SiGe Technology and Device Meeting, Meeting Abstract, pp. 230-231, May (2004).

In such related-art examples, only one type of carriers, electrons, are used to write or delete data to the floating gate; therefore, a positive or negative voltage must be applied to the control gate when data is written or deleted. For this reason, for example, even a large-scale integrated circuit (LSI) including a low-voltage drive logic circuit and a non-volatile memory requires an operation of a high-voltage drive circuit. This may lead to an increase in chip area of the LSI, resulting in an increase in manufacturing cost or deterioration of the reliability of the low-voltage drive circuit.

Also, in the device structure of such a non-volatile memory, it is not possible to realize a thin gate insulating film or an abrupt source/drain junction to ensure the reliability at the time when the memory is being driven at a high voltage. Therefore, there is a limitation in reducing the size of the device. Further, the inability to realize a thin gate insulating film or an abrupt source/drain junction means that the drain current of the MOS transistor is small when data is read. Therefore, the related-art examples cannot sufficiently read data at a low voltage or at a high speed.

SUMMARY

An advantage of the invention is to provide a semiconductor device that enables write and deletion of data at a low voltage, and a manufacturing method thereof.

According to a first aspect of the invention, a semiconductor device includes a substrate, a first insulating film, a first semiconductor layer disposed above the substrate with the first insulating film therebetween, a second semiconductor layer disposed above the first semiconductor layer with a second insulating film therebetween, a first conductivity type metal oxide semiconductor (MOS) disposed on at least one side surface of the first semiconductor layer, a second conductivity type MOS disposed on at least one side surface of the second semiconductor layer, a charge storage layer common to the first and second MOS transistors, and a control gate common to the first and second MOS transistors. The common charge storage layer is continuously provided from the side surface of the first semiconductor layer on which the first conductivity type MOS transistor is disposed to the side surface of the second semiconductor layer on which the second conductivity type MOS transistor is disposed.

Here, the "first semiconductor layer" according to the invention is, for example, a monocrystal silicon (Si) layer. The "first conductivity type" according to the invention is either one of p-type and n-type, and the "second conductivity type" is the other of p-type and n-type. For example, if the first conductivity type is a p-type channel, the second conductivity type is an n-type channel. The "tunnel gate insulating film" according to the invention refers to an insulating film through which electrons or holes pass due to a tunneling effect or energy that exceeds a barrier. In the invention, carriers are provided from the first semiconductor layer or the second semiconductor layer to the charge storage layer via this insulating film. This insulating film has a thickness of several nanometers on a $SiO_2$ film thickness basis. Due to such a small thickness, hot carriers not only leap over an energy barrier but also are provided to the charge storage layer due to the tunneling effect of an electric field between the source and the gate electrode. For this reason, in the invention, this insulating film is called a tunnel gate insulating film. The "charge storage layer" according to the invention refers to a layer for storing carriers (electrons or holes) that have passed through the tunnel gate insulating film. The charge storage layer is, for example, a semiconductor film made of polysilicon (poly-Si) or the like, to which a p-type or n-type impurity is introduced, a metal thin film made of Ti, Ta, TiN, TaN, or the like, an insulating film such as a $Si_3N_4$ film, or a high resistance semiconductor such as intrinsic poly-Si.

According to a second aspect of the invention, a semiconductor device includes a substrate, a first insulating film, a first semiconductor layer disposed above the substrate with the first insulating film therebetween, a second semiconductor layer disposed above the first semiconductor layer with a second insulating film therebetween, a first conductivity type metal oxide semiconductor (MOS) disposed on at least one side surface of the first semiconductor layer, a second conductivity type MOS disposed on at least one side surface and an upper surface of the second semiconductor layer, a charge storage layer common to the first and second MOS transistors, and a control gate common to the first and second MOS transistors. The common charge storage layer is continuously provided from the side surface of the first semiconductor layer on which the first conductivity type MOS transistor is disposed to the upper surface of the second semiconductor layer via the side surface of the second semiconductor layer on which the second conductivity type MOS transistor is disposed.

According to a third aspect of the invention, a semiconductor device includes a substrate, a first insulating film, a first semiconductor layer disposed above the substrate with the first insulating film therebetween, a second semiconductor layer disposed above the first semiconductor layer with a second insulating film therebetween, a first conductivity type metal oxide semiconductor (MOS) disposed on at least one side surface of the first semiconductor layer, a second conductivity type MOS disposed on at least one side surface and an upper surface of the second semiconductor layer, a charge storage layer common to the first and second MOS transistors, and a control gate common to the first and second MOS transistors. The common charge storage layer is continuously provided from the side surface of the first semiconductor layer on which the first conductivity type MOS transistor is disposed to the side surface of the second semiconductor layer on which the second conductivity type MOS transistor is disposed, and is not provided on the upper surface of the second semiconductor layer.

In the semiconductors according to the above-mentioned aspects of the invention, electrons are provided from the n-type MOS transistor to the common charge storage layer and holes are provided from the p-type MOS transistor thereto. Selectively providing electrons and holes to the charge storage layer allows changing of the potential of the common charge storage layer, thereby allowing controlling the threshold voltages of the p-type and n-type MOS transistors. For example, when data is written, electrons are provided to the common charge storage layer so as to change the respective threshold voltages of the MOS transistors. When data is deleted, holes are provided to the common charge storage layer so as to recombine the stored electrons with the holes (or so as to balance the negative charge of the trapped electrons with the positive charge of the holes), thereby restoring the threshold voltages of the MOS transistors to their respective states before the data is written.

As described above, in the semiconductors according to the above-mentioned aspects of the invention, write and deletion of data is realized by providing the two types of carries, electrons and holes, to the common charge storage layer. Therefore, unlike the related art examples, there is no need for applying a high, positive or negative voltage to the control gate when data is written or deleted, thereby eliminating the need for providing a high voltage drive circuit. This allows a reduction in chip area of the LSI, as well as allows write and deletion of data on a low voltage power supply using a battery, etc.

Also, in the semiconductor device according to one of the aspects of the invention, the channel area of the second conductivity type MOS transistor is increased. Therefore, data is written or deleted at a higher speed. Further, according to the semiconductor device according to the third aspect of the invention, the control gate's current controllability over the second conductivity type MOS transistor is improved. Thus, data is read at a low voltage as well as at a high speed.

The semiconductor devices according to the above-mentioned aspects of the invention each include a p-channel MOS transistor and an n-channel MOS transistor, as well as include a control gate common to the p-channel and n-channel MOS transistors. Therefore, on/offs of these MOS transistors are changed at the same timing, thereby making the semiconductor devices according to the first to third aspects of the invention applicable to, for example, a NOR circuit or the like.

In the semiconductor device according to the first aspect of the invention, a drain of the first conductivity type MOS transistor and a drain of the second conductivity type MOS transistor are preferably electrically coupled to each other.

This feature allows the drain of the first conductivity type MOS transistor and that of the second conductivity type MOS transistor to share wiring, thereby making the area of the wiring on the chip smaller.

In the semiconductor device according to the third aspect of the invention, a tunnel gate insulating film of a portion of the second conductivity type MOS transistor disposed on the side surface of the second semiconductor layer is preferably thinner than a gate insulating film of a portion of the second conductivity type MOS transistor disposed on the upper surface of the second semiconductor layer.

In the semiconductor device according to the third aspect of the invention, with respect to an energy barrier that occurs due to contact with the second semiconductor layer, a tunnel gate insulating film of a portion of the second conductivity type MOS transistor disposed on the side surface of the second semiconductor layer is preferably an energy barrier lower than an energy barrier of a gate insulating film of a portion of the second conductivity type MOS transistor disposed on the upper surface of the second semiconductor layer.

Since the energy barrier of the tunnel insulating film is low, hot carriers with low energy are implanted into the charge storage layer. This reduces the drive voltage, thereby allowing efficient implantation of carriers into the charge storage layer without implanting carriers into the gate film formed on the upper surface of the second semiconductor layer.

In the semiconductor device according to the third aspect of the invention, the tunnel gate insulating film has a lower potential barrier to carriers than that of the gate insulating film of the portion of the second conductivity type MOS transistor formed on the upper surface of the second semiconductor layer. Therefore, when data is written or deleted, carriers are easily moved to the charge storage layer via the tunnel gate insulating film.

According to a fourth aspect of the invention, a semiconductor device manufacturing method includes: sequentially forming a first sacrifice semiconductor layer, a first semiconductor layer, a second sacrifice semiconductor layer, and a second semiconductor layer on a semiconductor substrate; sequentially etching the second semiconductor layer, the second sacrifice semiconductor layer, the first semiconductor layer, and the first sacrifice semiconductor layer to form a first groove that penetrates the second semiconductor layer, the second sacrifice semiconductor layer, the first semiconductor layer, and the first sacrifice semiconductor layer; forming a supporter for supporting the first and second semiconductor layers in the first groove; after having formed the supporter, partially and sequentially etching the second semiconductor layer, the second sacrifice semiconductor layer, the first semiconductor layer, and the first sacrifice semiconductor layer to form a second groove for exposing respective side surfaces of the second semiconductor layer, the second sacrifice semiconductor layer, the first semiconductor layer, and the first sacrifice semiconductor layer; etching the first and second sacrifice semiconductor layers via the second groove under an etching condition in which the first and second sacrifice semiconductor layers are more subject to etching than the first and second semiconductor layers so as to form a first cavity between the semiconductor substrate and the first semiconductor layer and a second cavity between the first and second semiconductor layers; forming a first insulating film in the first cavity and a second insulating film in the second cavity; and after having formed the first and second insulating films, forming a first conductivity type metal oxide semiconductor (MOS) transistor on the side surface of the first semiconductor layer that faces the second groove and a second conductivity type MOS transistor on the side surface of the second semiconductor layer that faces the second groove. In the step of forming the first and second conductivity type MOS transistors, a tunnel gate insulating film is formed on the side surfaces of the first and second semiconductor layers that each face the second groove, a common charge storage layer is formed from the side surface of the first semiconductor layer to the side surface of the second semiconductor layer so as to cover the tunnel gate insulating film, a gate insulating film is formed from the side surface of the first semiconductor layer to the side surface of the second semiconductor layer so as to cover the charge storage layer, and after having formed the gate insulating film, a common control gate is formed from the side surface of the first semiconductor layer to the side surface of the second semiconductor layer so as to cover the gate insulating film.

Here, the "first semiconductor layer" and the "second semiconductor layer" according to the invention are, for example, monocrystal Si layers, as described above. The "first semiconductor layer" and the "second semiconductor layer" are, for example, monocrystal silicon germanium (SiGe) films.

According to the method for manufacturing a semiconductor device according to the fourth aspect of the invention, the semiconductor devices according to the first to third aspects of the invention are manufactured applying the so-called SBSI method. As a result, write and deletion of data to the charge storage layer is realized by providing the two types of carriers, electrons and holes, thereto. Thus, a semiconductor device is provided that is driven at a low voltage and prevents an increase in chip area.

BRIEF DESCRIPTION OF THE DRAWINGS

The invention will be described with reference to the accompanying drawings, wherein like numbers reference like elements.

DESCRIPTION OF EXEMPLARY EMBODIMENTS

A semiconductor device and a manufacturing method thereof according to the invention will now be described.

Figure 1A:
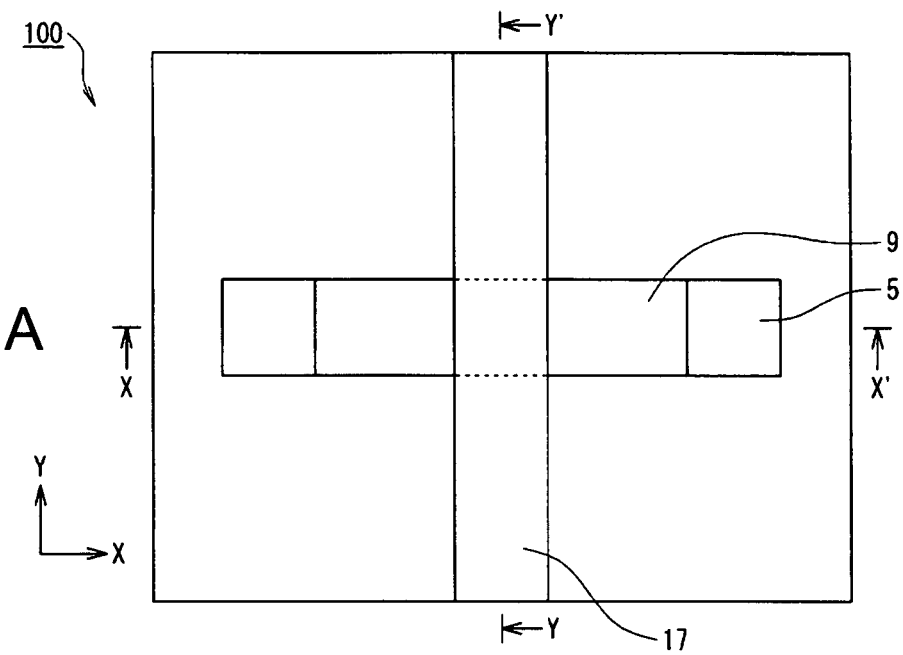
FIGS. 1A to 1C are a non-volatile memory 100 according to an embodiment of the invention.
Figure 1B:
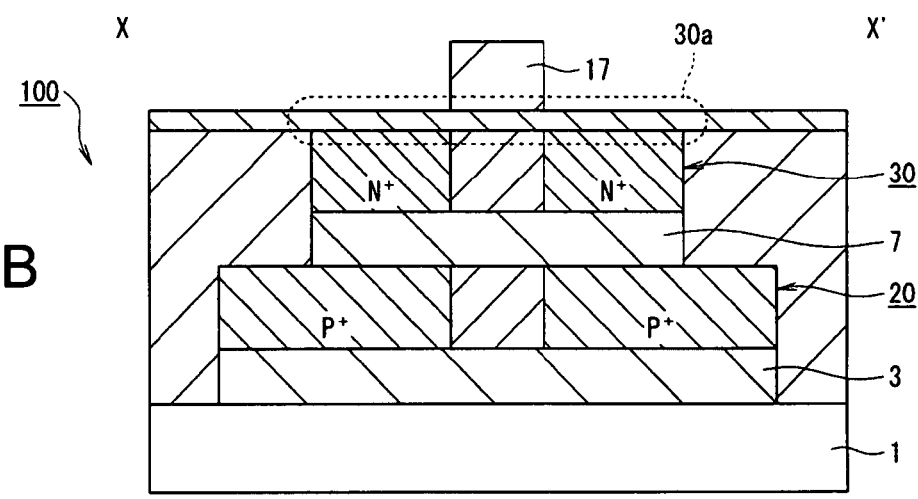
Figure 1C:
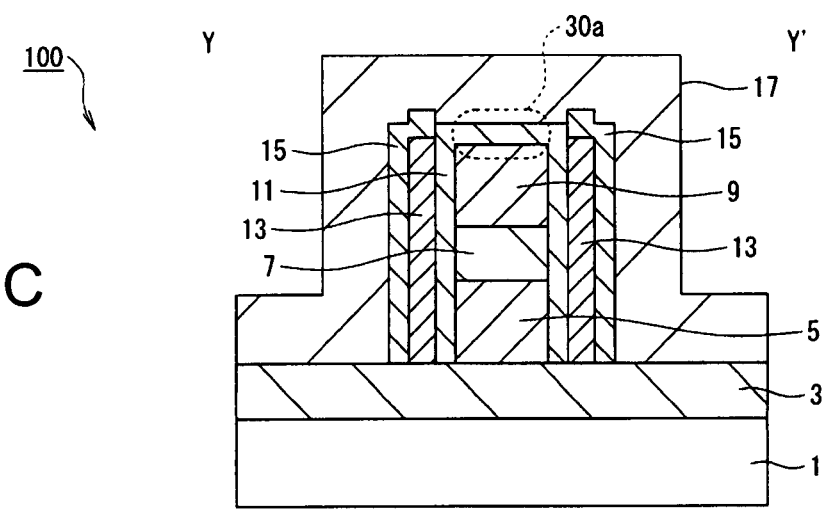

FIGS. 1A and 1B are drawings showing an example configuration of a non-volatile memory 100 according to an embodiment of the invention. FIG. 1A is a plan view, FIG. 1B is a sectional view taken along line X-X' of FIG. 1A, and FIG. 1C is a sectional view taken along line Y-Y of FIG. 1A. Note that no inter-insulating film is shown in FIG. 1A so that the example configuration of the non-volatile memory 100 is easily understood in a plan view.

As shown in FIG. 1A to 1C, in the non-volatile memory 100, a first monocrystal Si layer 5 is formed above a Si substrate 1 with an insulating film 3 therebetween, and a second monocrystal Si layer 9 is formed above the first monocrystal Si layer 5 with an insulating film 7 therebetween. For example, the insulating films 3 and 7 are silicon oxide ($SiO_2$) films. For example, the monocrystal Si films (hereafter simply referred to as "Si layers") 5 and 9 are elongated boxes disposed so that these films are in parallel with the line X-X' and so that the centers thereof are matched in a plan view. Formed on the side surfaces of the Si layer 5 is a p-type MOS field-effect transistor (hereafter simply referred to as a "PMOS") 20. Formed on the side surfaces and the upper surface of the Si layer 9 is an n-type MOS field-effect transistor (hereafter simply referred to as an "NMOS") 30. More specifically, the channel region of the PMOS 20 is formed on the side surfaces of the Si layer 5, and that of the NMOS 30 is formed on the side surfaces of the Si layer 9.

Here, the PMOS 20 and NMOS 30 are non-volatile memory transistors and have a common floating gate 13 and a common control gate 17. Specifically, in FIG. 1C, the floating gate 13 is continuously formed on the right sides of the Si layers 5 and 9 with a tunnel gate insulating film 11 therebetween. Also, the floating gate 13 is continuously formed on the left sides of the Si layers 5 and 9 with the tunnel gate insulating film 11 therebetween. While the tunnel gate insulating film 11 may be made of $SiO_2$, it is preferably an insulating film whose band gap (that is, the difference in energy between the conduction band Ec and the valence band Ev) is smaller than that of $SiO_2$ and whose energy barrier (potential barrier) is lower than that of $SiO_2$. Insulating films having such an energy barrier include a $Si_3N_4$ film, a $Ta_2O_5$ film, a $BaTiO_3$ film, a $ZrO_2$ film, a HfO film, a $Y_2O_3$ film, and a $ZrSiO_2$ film.

As described above, if the tunnel gate insulating film 11 is a $Si_3N_4$ film or the like, it serves as a lower energy barrier against carriers (electrons or holes) moving from the Si layers 5 and 9 to the floating gate 13 than a $SiO_2$ film. This reduces the voltage necessary to write or delete data.

For example, the floating gate 13 is a semiconductor film made of polysilicon (poly-Si) or the like to which a p-type or n-type impurity is introduced, or a metal thin film made of Ti, Ta, TiN, TaN, or the like. The floating gate 13 is electrically insulated (that is, electrically floating) from surrounding conductive layers by the tunnel gate insulating film 11 and the gate insulating film 15. Further, the control gate 17 is formed outside the floating gate 13 with the gate insulating film 15 therebetween. As shown in FIGS. 1A to 1C, the control gate 17 is formed in a manner that it straddles near the centers of the Si layers 5 and 9 formed above the Si substrate 1. The sour/drain (P+) of the PMOS 20 is formed outside the Si layer 5 except for the control gate 17 and the sour/drain (N−) of the NMOS 30 is formed outside the Si layer 9 except for the control gate 17.

As described above, in the non-volatile memory 100 according to this embodiment, the Si layers 5 and 9 are formed above the Si substrate 1 with the insulating film 3 between the Si substrate 1 and Si layer 5 and the insulating film 7 between the Si layers 5 and 9. The PMOS 20 and the NMOS 30 that are non-volatile transistors are formed on the side surfaces of the Si layers 5 and 9, respectively, and have the common floating gate 13 and the common control gate 17.

According to these features, electrons are provided from the NMOS 30 to the floating gate 13 and, in addition, holes are provided from the PMOS 20 thereto. Therefore, changing the amount of electrons or holes to be provided to the floating gate 13 allows control of the threshold voltages of the PMOS 20 and the NMOS 30. In other words, write and deletion of data to the floating gate 13 is realized by providing the two types of carries, electrons and holes, thereto.

Incidentally, the amount of energy necessary to form an electron-hole pair in Si is approximately 1.1 eV. The amount of energy necessary for an electron to leap from Si into $SiO_2$ in a state in which Si and $SiO_2$ are in contact with each other is approximately 3.2 eV, while the amount of energy necessary for a hole to leap from Si into $SiO_2$ in the above-mentioned contact state is approximately 4.8 eV. Therefore, it is sufficient that the voltage necessary to write or delete data in the PMOS 20 and the NMOS 30 is approximately 4.8 V at maximum. Use of a tunnel insulating film whose potential barrier is lower than that of $SiO_2$ further reduces the voltage necessary to write or delete data.

Due to the existence of a lucky carrier, a hole that leaps from Si to $SiO_2$ at a voltage lower than 4.8 V also exits. However, a certain level of voltage is required to reduce the time for writing or deleting data, so a drive voltage of the order of 3 to 5 V is appropriate. Further, it is sufficient to set a voltage Vcg to be applied to the control gate 17, to the drain potential of the NMOS 30 (that is, the source potential of the PMOS 20) when electrons are implanted to the floating gate 13 and to set the voltage Vcg to the source potential of the NMOS 30 (that is, the drain potential of the PMOS 20) when holes are implanted to the floating gate 13. According to such settings, the maximum potential difference among the source, body, drain, and gate in each of the PMOS 20 and the NMOS 30 will not exceed 5 V.

Also, even if an LSI includes the non-volatile memory 100 shown in FIGS. 1A to 1C and a low-voltage drive logic circuit, the maximum voltage is approximately 5 V. This allows substantial solution of the problems of an increase in cost of the LSI due to an increase in chip area of the LSI and the deterioration of the reliability of the low-voltage drive logic circuit. Also, in the device structure of the non-volatile memory 100, a thin gate insulating film or an abrupt source/drain junction are realized, resulting in a reduction in size of the device. Further, such a thin gate insulating film or an abrupt source/drain junction increases the drain current, thereby allowing read of data at a low voltage or at a high speed.

A method for writing and deleting data (e.g., a program) and a method for reading data in the non-volatile memory 100 shown in FIGS. 1A to 1C will now be described.

Data is written and deleted as follows. For example, assume that the power supply voltages are defined as Vss (0 V) and Vdd (5 V). If the gate voltage common to the PMOS and the NMOS and the drain voltage common to the PMOS and the NMOS are set to Vdd, the NMOS 30 is on and the PMOS 20 is off. Here, the gate voltage common to the PMOS and the NMOS refers to a voltage to be applied to the control gate 17. According to these voltage settings, in the NMOS 30, electrons flow from the source to the drain and are accelerated due to a high electric field or electron-hole pairs are formed due to impact ionization so that hot carriers are generated. Hot electrons go beyond an oxide/silicon barrier, and are pulled by the control gate 17 being subjected to Vdd, and implanted into the floating gate 13. At the same time, carriers are provided to the floating gate as a Fowler-Nordheim current via the tunnel film due to an electric field between the source and the control gate electrode.

On the other hand, the drain voltage common to the PMOS and the NMOS is set to Vss, the NMOS 30 is off and the PMOS 20 is on. In the PMOS 20, holes flow from the source to the drain and are accelerated due to a high electric field, or electron-hole pairs are formed due to impact ionization so that hot carriers are generated. Hot holes go beyond an oxide film/silicon barrier, and are pulled by the control gate 17 being subjected to Vss, and implanted into the floating gate 13. At the same time, carriers are provided to the floating gate as a Fowler-Nordheim current via the tunnel film due to an electric field between the source and the control gate electrode. Such electron/hole implantation allows write and deletion of data.

Data is read as follows. For example, assume that the power supply voltage are defined as Vss (0 V) and Vdd (3 to 5 V). If the gate voltage common to the PMOS and the NMOS and the drain voltage common thereto are set to the same potential (e.g., Vdd/2) as that of the source of the PMOS 20, the channel is off in the PMOS 20 and no current passes therethrough. On the other hand, in the NMOS 30, a potential of Vdd/2-Vss is applied between the source and drain and also applied between the control gate 17 and the source. Therefore, while the channel is off in the NMOS 30 and no current passes therethrough if many electrons are stored in the floating gate 13, the channel is on and electrons flow from the source to the drain if a few electrons are stored in the floating gate 13 or holes are stored therein.

As shown in FIGS. 1A to 1C, a portion (hereafter, referred to as a "NMOS 30A") of the NMOS 30 formed on the upper surface of the Si layer 9 has the common control gate 17 as a gate electrode and does not have the floating gate 13, the control gate 17's current controllability over the entire NMOS 30 is improved so that data is read at a low voltage or at a high speed. On the other hand, if the NMOS 30A has the floating gate 13 (that is, if the floating gate 13 is disposed between the control gate 17 and the upper surface of the Si layer 9), the area of the channel region of the n-type non-volatile memory transistor is increased so that data is written and deleted at a high speed.

Figure 23:
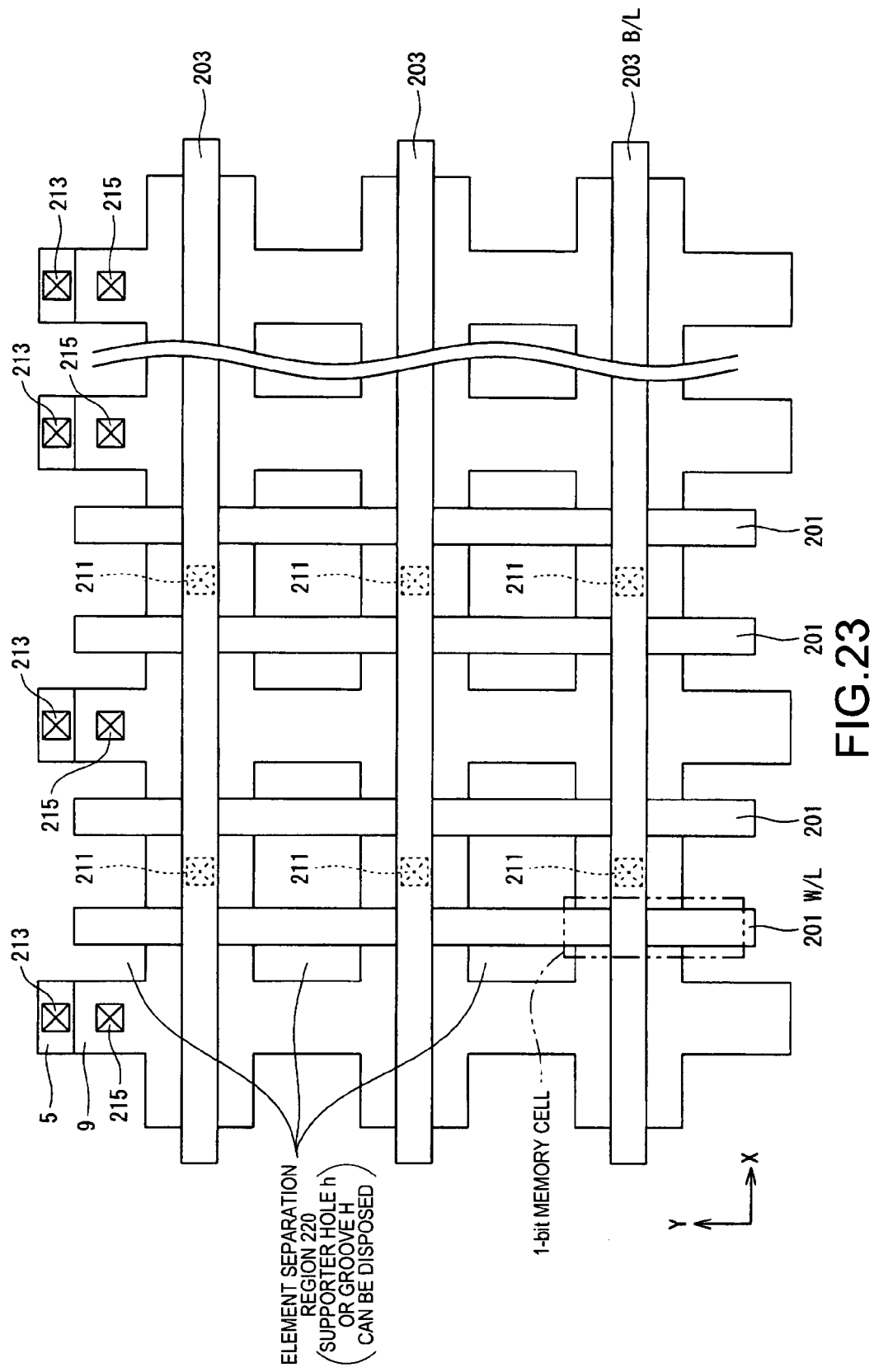
FIG. 23 is a plan view showing an example configuration of a DiNOR circuit 200 according to this embodiment.
Figure 24:
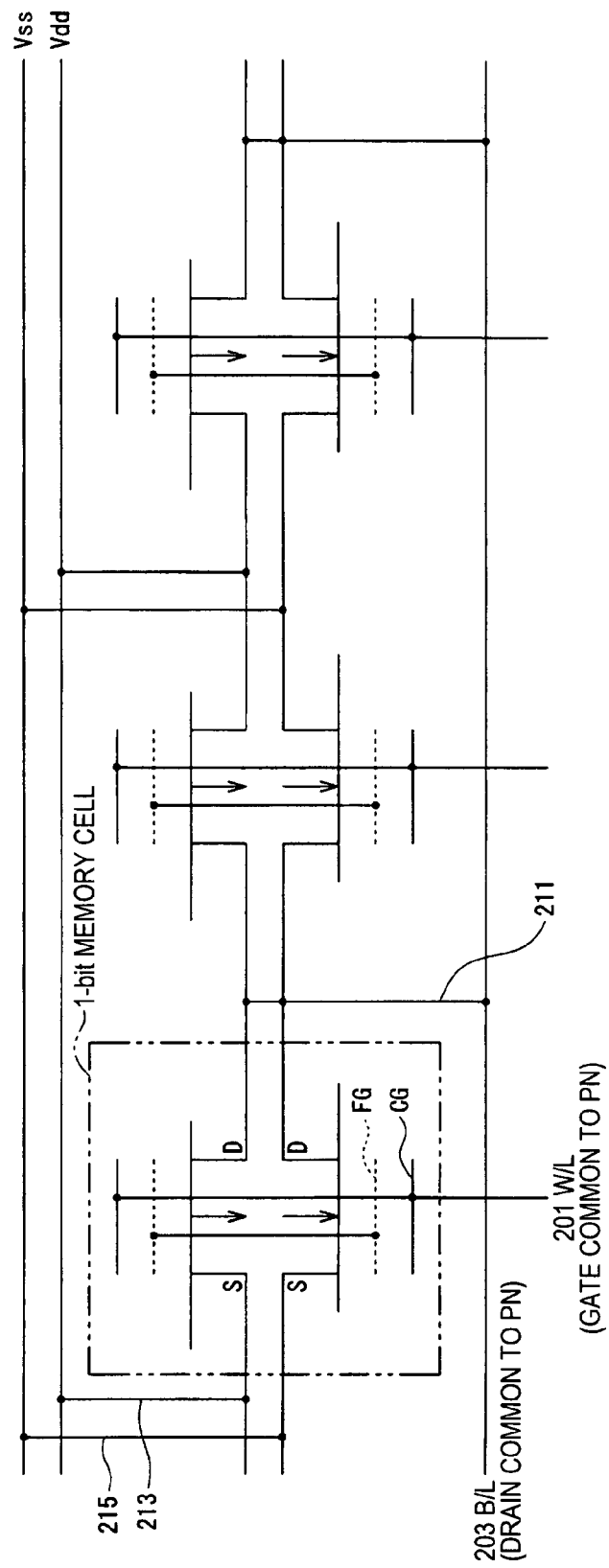
FIG. 24 is a plan view showing the example configuration of the DiNOR circuit 200.

An example of a circuit that uses the two layers, the Si layers 5 and 9, formed above the Si substrate 1 as Vdd and Vss lines will now be described. FIG. 23 is a plan view showing an example configuration of a divided bit line NOR flash memory (DiNOR) circuit 200 according to this embodiment. FIG. 24 is a circuit diagram showing an example configuration of the DiNOR 200. In the DiNOR circuit 200, each 1-bit memory cell includes the non-volatile memory 100 shown in FIGS. 1A to 1C.

As shown in FIG. 23, the Si layers 5 and 9, which are formed above the Si substrate with the insulating layers therebetween, form a lattice extending in the X and Y directions in a plan view. Word lines (W/L) 201 are disposed along the Y direction above the Si substrate 1 so as to be perpendicular to portions of the Si layers 5 and 9 extending in the X direction. The word lines (W/L) 201 corresponds to the common control gate 17 shown in FIGS. 1A and 1C. Further, bit lines (B/L) lines 203 are disposed above the Si substrate so as to run directly above the portions of the Si layers 5 and 9 extending in X the direction.

In this example, the bit lines 203 run above the word lines 201 with an insulating film therebetween. The drain (D) of each PMOS and that of each NMOS have a common contact electrode 211, and are coupled to one of the bit lines 203 via the common contact electrode 211. Further, the source (S) of each PMOS is drawn out onto the insulating film via a contact electrode 213 and is coupled to, for example, the power supply Vdd via wiring, as shown in FIG. 24. The source (S) of each NMOS is drawn out onto the insulating film via a contact electrode 215 and is coupled to, for example, the power supply Vss via wiring, as shown in FIG. 24. In FIGS. 23 and 24, a portion enclosed by a double-dashed line is a 1-bit memory cell, that is, the non-volatile memory 100.

As described above, in the DiNOR circuit 200 shown in FIGS. 23 and 24, the two layers, Si layers 5 and 9, formed above the Si substrate are used as a Vdd line and a Vss line, respectively. This allows commonality of the contact electrode 211 between the drains (D) of the PMOS and the NMOS, thereby reducing the number of contacts. Thus, the density of the DiNOR circuit 200 is improved.

A method for manufacturing the non-volatile memory 100 shown in FIGS. 1A to 1C will now be described.

FIGS. 2A to 21B are drawings showing a method for manufacturing the non-volatile memory 100 according to this embodiment. FIGS. 2A to 21A are process sectional views leading to FIG. 1B, which is a sectional view taken along line X-X' of FIG. 1A. FIGS. 2B to 21B are process sectional views leading to FIG. 1C, which is a sectional view taken along line Y-Y' of FIG. 1A. Hereafter, a method for manufacturing the non-volatile memory 100 shown in FIG. 1A to 1C applying the SBSI method will be described.

Figure 2A:
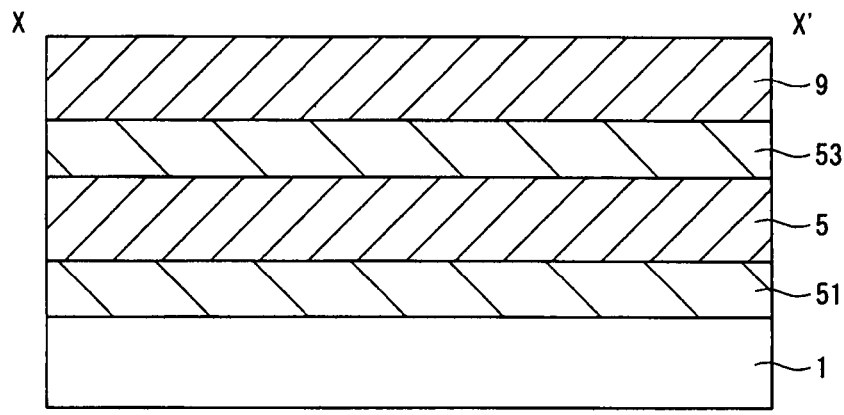
FIGS. 2A and 2B are drawings showing a method for manufacturing the non-volatile memory 100.
Figure 2B:
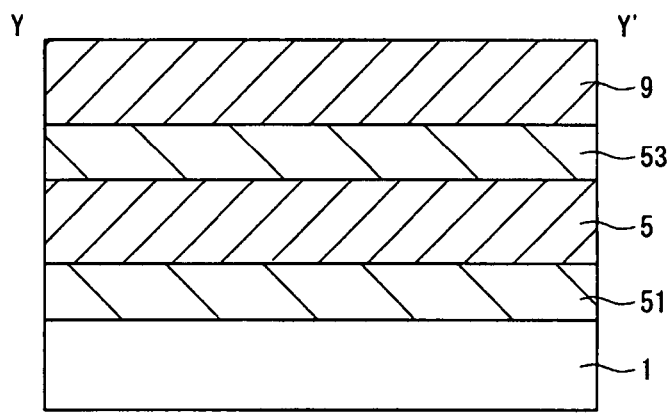

First, in FIGS. 2A and 2B, a not shown silicon buffer (Si-buffer) layer is formed on the Si substrate 1, and then the monocrystal SiGe layer 51, the monocrystal Si layer 5, the monocrystal SiGe layer 53, and the monocrystal Si layer 9 are sequentially formed on the silicon buffer layer. These layers are continuously formed by epitaxial growth.

Figure 3A:
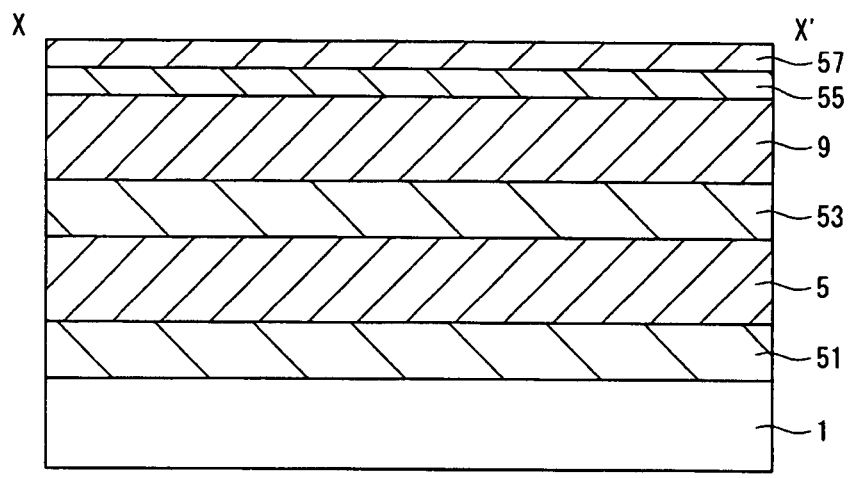
FIGS. 3A and 3B are drawings showing the method for manufacturing the non-volatile memory 100.
Figure 3B:
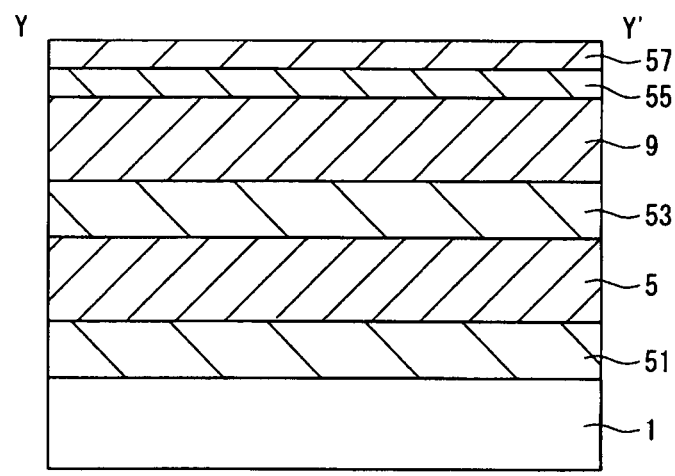

Next, as shown in FIGS. 3A and 3B, the Si layer 9 is thermally oxidized to form a $SiO_2$ film 55 on a surface thereof. Then, a SiN film 57 is formed on the entire surface of the $SiO_2$ film 55 by chemical vapor deposition. The SiN film 57 serves as an antioxidant film for preventing oxidation of the Si layers 5 and 9 and the SiGe layers 51 and 53, as well as serves as a stopper layer when chemical mechanical polishing is performed in subsequent processes. Note that the method for forming the $SiO_2$ film 55 is not limited to thermal oxidation and may be, for example, chemical vapor deposition.

Figure 4A:
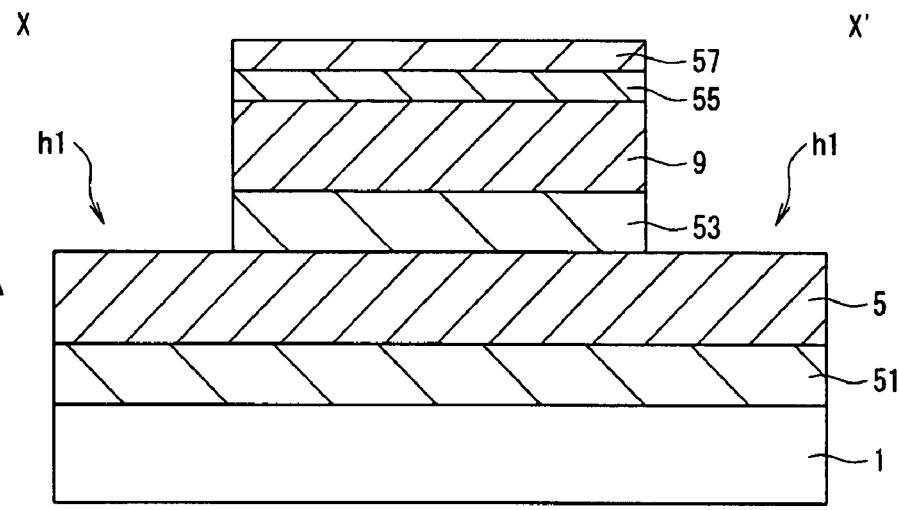
FIGS. 4A and 4B are drawings showing the method for manufacturing the non-volatile memory 100.
Figure 4B:
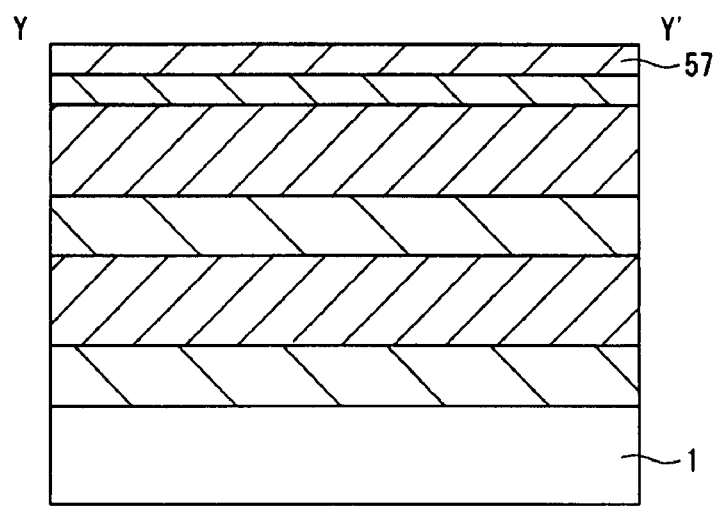
Figure 5A:
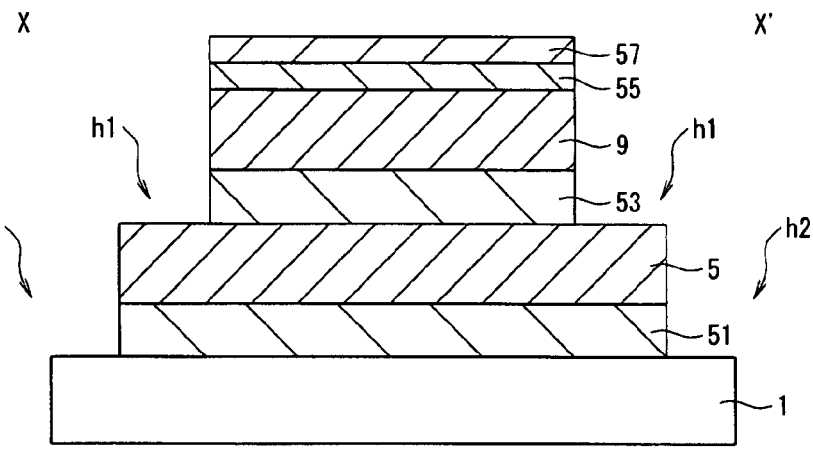
FIGS. 5A and 5B are drawings showing the method for manufacturing the non-volatile memory 100.
Figure 5B:
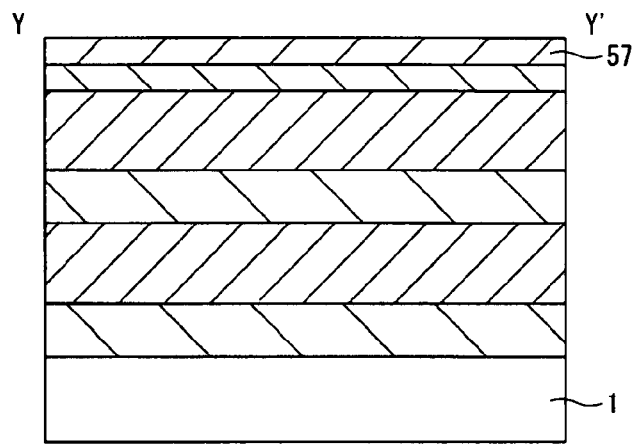

Next, as shown in FIGS. 4A and 4B, the SiN film 57, the $SiO_2$ film 55, the Si layer 9, and the SiGe layer 53 are partially and sequentially etched by photolithography and etching. Thus, a shallow supporter hole h1 that penetrates the Si layer 9 and the SiGe layer 53 and whose bottom is the surface of the Si layer 5 is formed in a region that overlaps an element separation region (that is, a region in which a silicon on insulator (SOI) structure is not formed) in a plan view. Next, as shown in FIGS. 5A and 5B, the Si layer 5 exposed on the bottom of the shallow supporter hole h1, and the SiGe layer 51 and the Si-buffer layer below the Si layer 5 are partially and sequentially etched by photolithography and etching. Thus, a deep supporter hole h2 that penetrates the Si layer 5 and the SiGe layer 51 and whose bottom is the upper surface of the Si substrate 1 is formed in a region that overlaps the element separation region in a plan view. Note that etching may be stopped on the upper surface of the Si substrate 1 in the etching process of forming the deep supporter hole h2 or the Si substrate 1 may be overetched to form a recess. Hereafter, the shallow supporter hole h1 and the deep supporter hole h2 will also collectively be referred to as a "supporter hole h" for convenience.

Figure 6A:
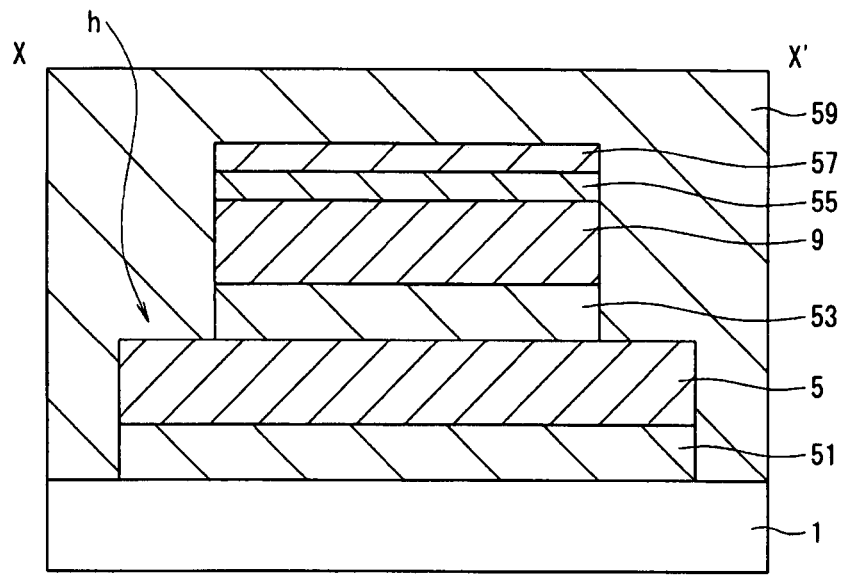
FIGS. 6A and 6B are drawings showing the method for manufacturing the non-volatile memory 100.
Figure 6B:
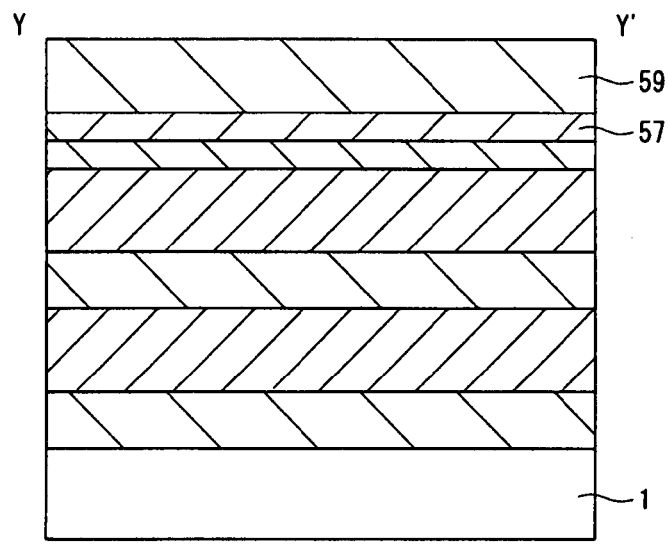
Figure 7A:
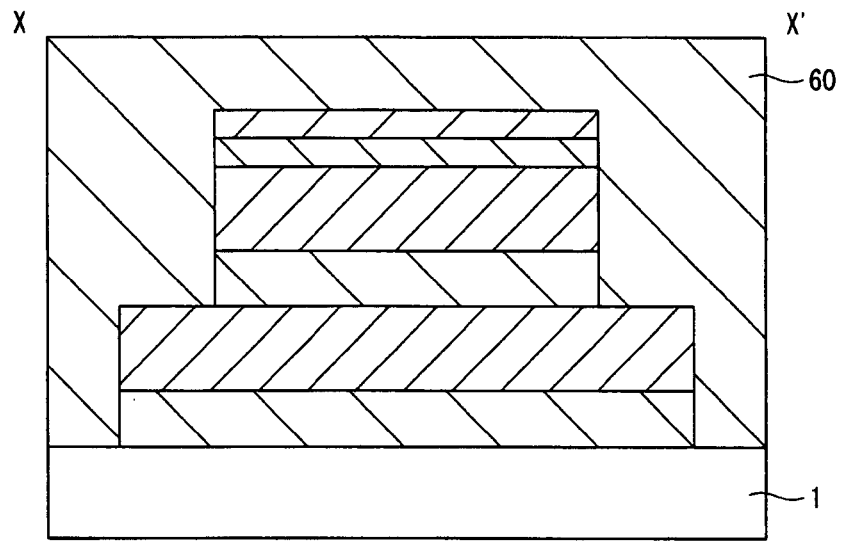
FIGS. 7A and 7B are drawings showing the method for manufacturing the non-volatile memory 100.
Figure 7B:
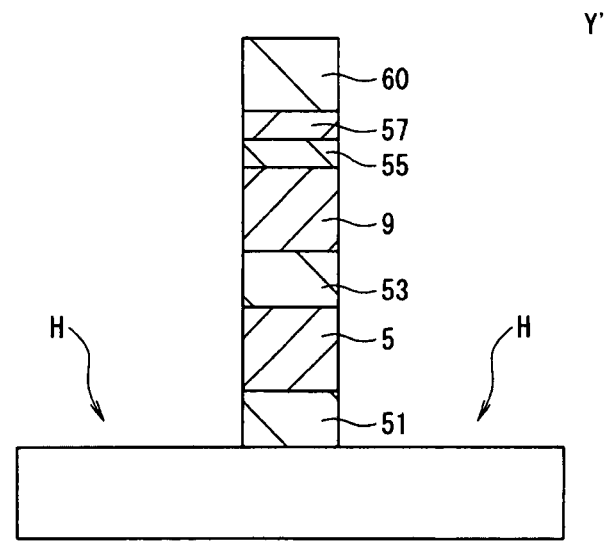

Next, as shown in FIGS. 6A and 6B, a supporter film 59 is formed on the entire upper surface of the Si substrate 1 in a manner that the supporter hole h is filled with the supporter film 59. For example, the supporter film 59 is a silicon oxide ($SiO_2$) film and is formed by chemical vapor deposition. Next, as shown in FIGS. 7A and 7B, the supporter film 59, the SiN film 57, the $SiO_2$ film 55, the Si layer 9, the SiGe layer 53, the Si layer 5, the SiGe layer 51, and the Si-buffer layer (not shown) are partially and sequentially etched by photolithography and etching so that a supporter 60 is formed of the supporter film 59 and so that a groove H for exposing the upper surface of the Si substrate 1, and the side surfaces of the Si layer 9, the SiGe layer 53, and the SiGe layer 51 is formed. Note that etching may be stopped on the upper surface of the Si substrate 1 in the etching process of forming the groove H or the Si substrate 1 may be overetched to form a recess.

Figure 8A:
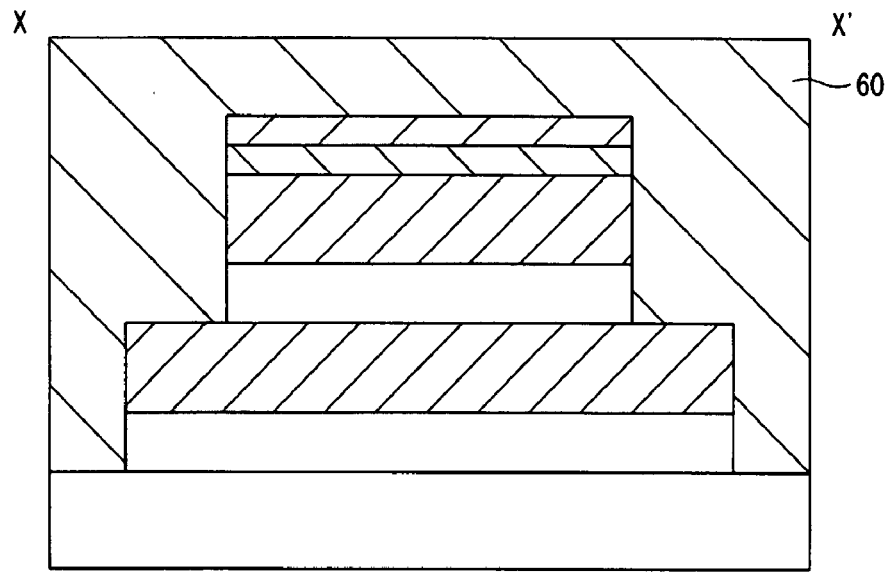
FIGS. 8A and 8B are drawings showing the method for manufacturing the non-volatile memory 100.
Figure 8B:
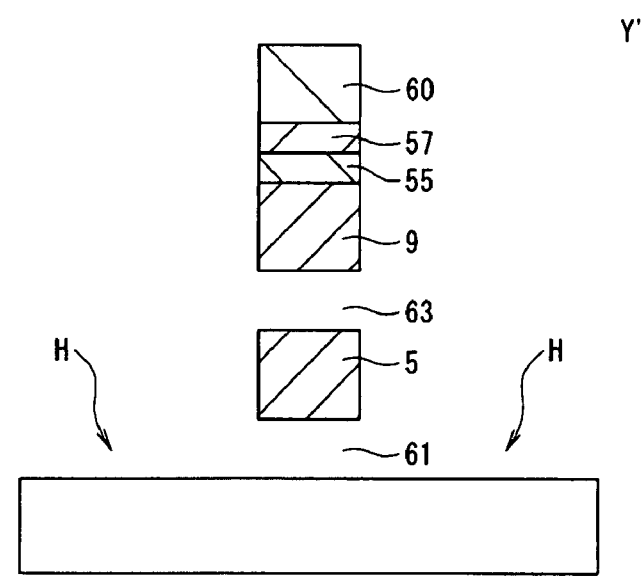

Next, in FIGS. 7A and 7B, a hydrofluoric-nitric acid solution is brought into contact with the side surfaces of the Si layers 5 and 9 and the SiGe layers 51 and 53 via the groove H so as to selectively etch and eliminate the SiGe layers 51 and 53. Thus, as shown in FIGS. 8A and 8B, a first cavity 61 is formed between the Si substrate 1 and the Si layer 5 and a second cavity 63 is formed between the Si layers 5 and 9. Here, if wet etching is performed using a hydrofluoric-nitric acid solution, the etching rate of SiGe is larger than that of Si (that is, SiGe has a larger etching selection rate than that of Si). This allows only the SiGe layers to be etched and eliminated while leaving the Si layers 5 and 9 intact. After the cavities 61 and 63 are formed, the upper surface and the side surfaces of the Si layer 9 are supported by the supporter 60 and the side surfaces of the Si layer 5 are supported by the supporter 60.

Figure 9A:
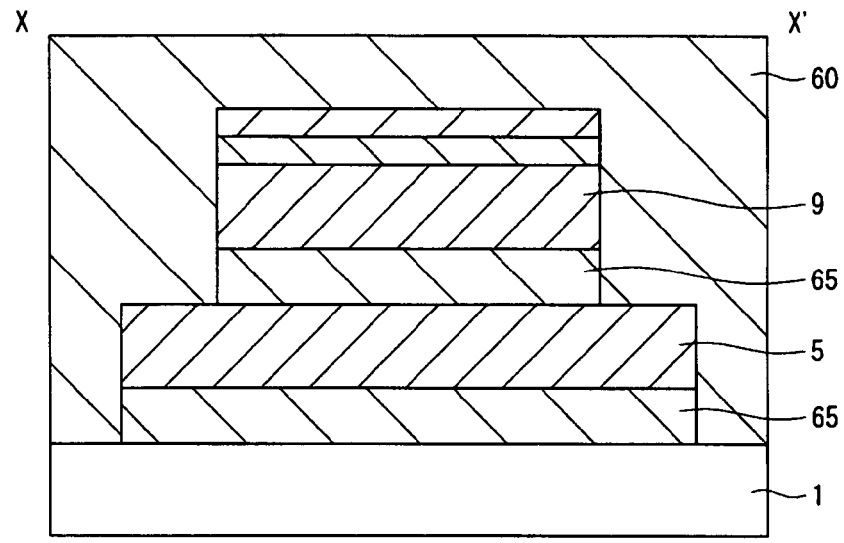
FIGS. 9A and 9B are drawings showing the method for manufacturing the non-volatile memory 100.
Figure 9B:
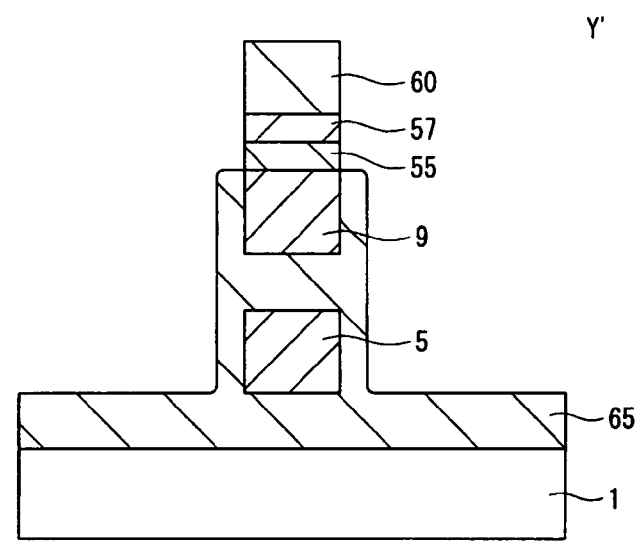

Next, in FIGS. 8A and 8B, the Si substrate 1 is cleaned using a dilute hydrofluoric acid (HF) solution. Then, the Si substrate 1 is disposed in an oxidized atmosphere, such as oxygen ($O_2$) or ozone ($O_3$), and heat-treated in this state. Thus, as shown in FIGS. 9A and 9B, surface oxidization proceeds on the surfaces of the Si layers 5 and 9, the Si-buffer layer (not shown), and the Si substrate 1 so that the cavities 61 and 63 are filled with the SiO film 65. Portions of the $SiO_2$ film 65 formed in the cavity 61 and on the upper surface of the Si substrate 1 serve as the insulating film 3 shown in FIGS. 1B and 1C, and a portion thereof formed in the cavity 63 serves as the insulating film 7.

Figure 10A:
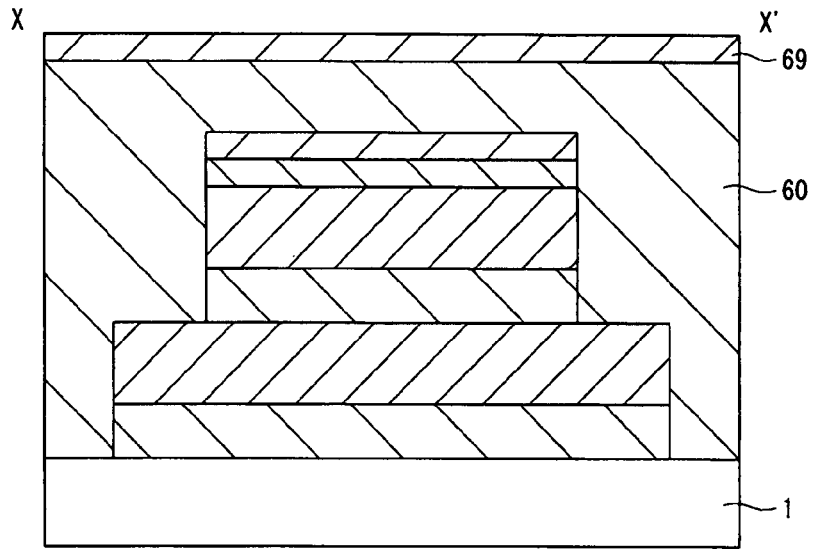
FIGS. 10A and 10B are drawings showing the method for manufacturing the non-volatile memory 100.
Figure 10B:
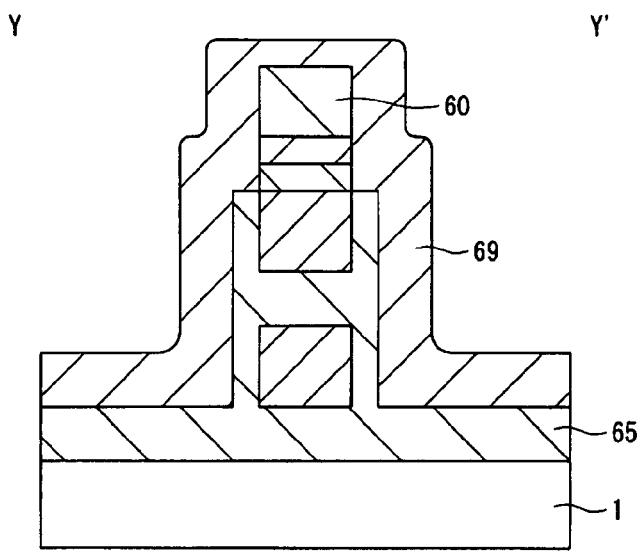
Figure 11A:
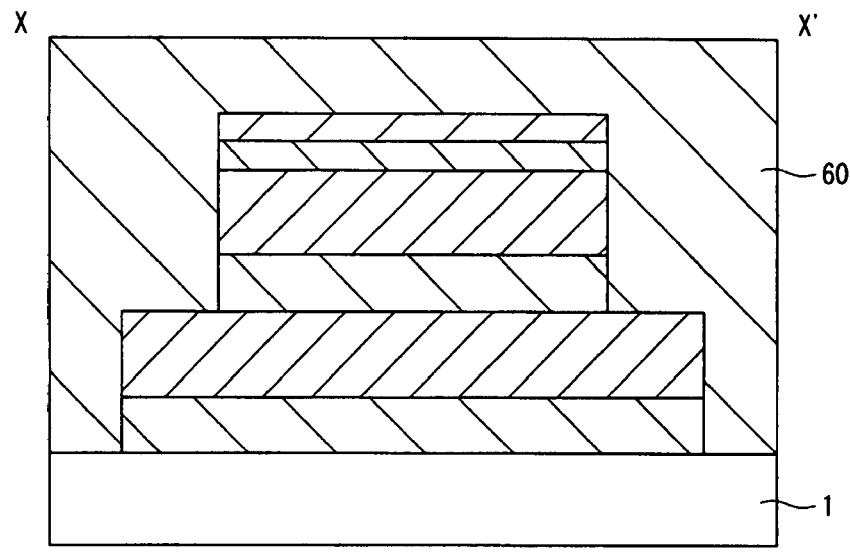
FIGS. 11A and 11B are drawings showing the method for manufacturing the non-volatile memory 100.
Figure 11B:
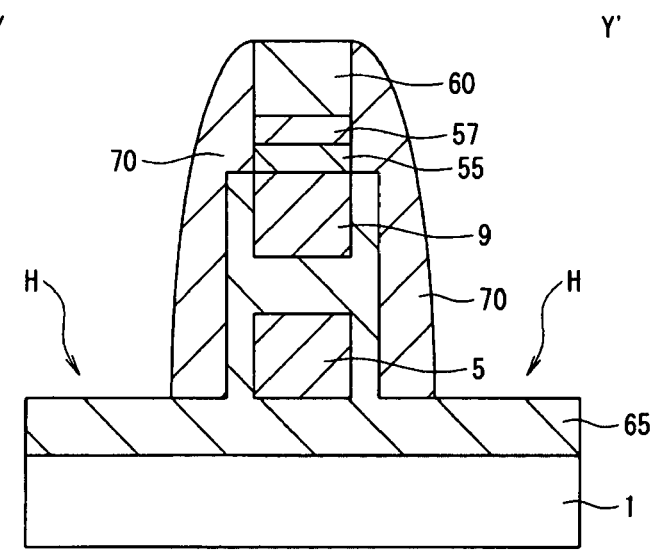

As shown in FIGS. 10A and 10B, a SiN 69 is formed entirely above the Si substrate 1. For example, the SiN film 69 is formed by chemical vapor deposition. Subsequently, the SiN film 69 is etched back using anisotropic dry etching. Thus, as shown in FIGS. 11A and 11B, a side wall 70 is formed on the side surfaces of the Si layers 5 and 9, the $SiO_2$ film 55, the SiN film 57, and the supporter 60 that face the groove H.

Figure 12A:
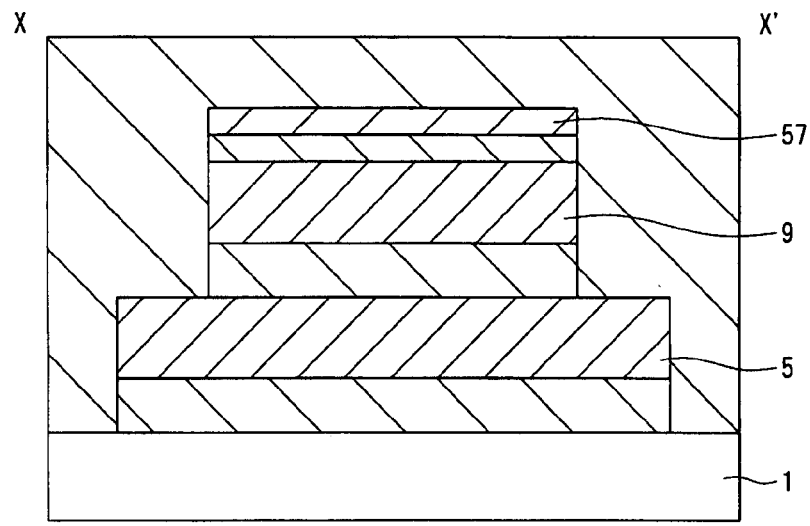
FIGS. 12A and 12B are drawings showing the method for manufacturing the non-volatile memory 100.
Figure 12B:
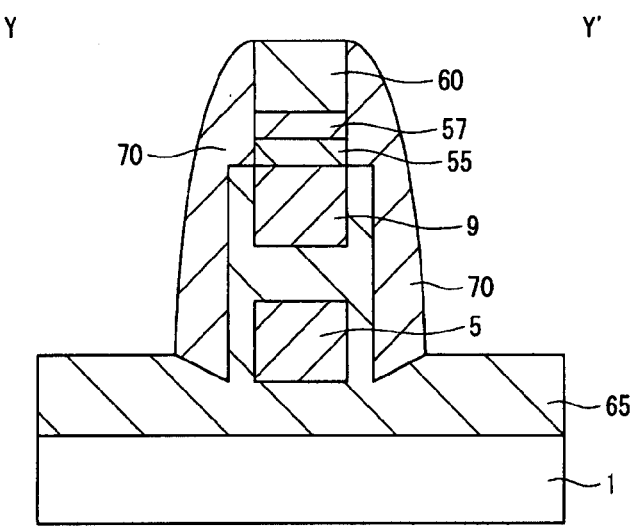

Next, as shown in FIGS. 12A and 12B, the Si substrate 1 is thermally oxidized so that a portion of the $SiO_2$ film 65 exposed from below the sidewall 70 is thickened. At that time, the side surfaces of the Si layers 5 and 9 are covered with the sidewall 70 formed of a SiN film and the upper surface of the Si layer 9 is covered with the SiN film 57; therefore, the Si layers 5 and 9 is not subject to oxidation. The purpose of thickening the substrate surface $SiO_2$ film 65 is to prevent exposure of the upper surface of the Si substrate 1 when the side surfaces of the Si layers 5 and 9 that face the groove H are exposed in a subsequent process to be shown in FIGS. 14A and 14B. The existence of the thick $SiO_2$ film 65 on the substrate surface allows a reduction in wiring capacitance of the word lines shown in FIG. 23.

Figure 13A:
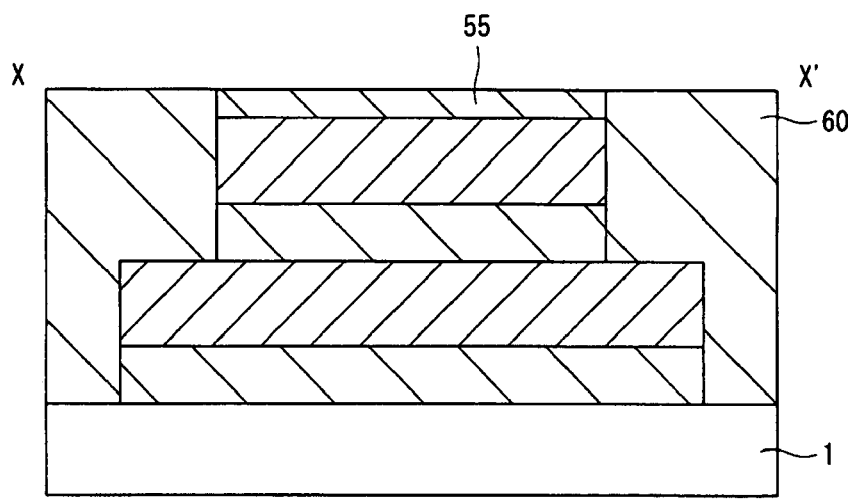
FIGS. 13A and 13B are drawings showing the method for manufacturing the non-volatile memory 100.
Figure 13B:
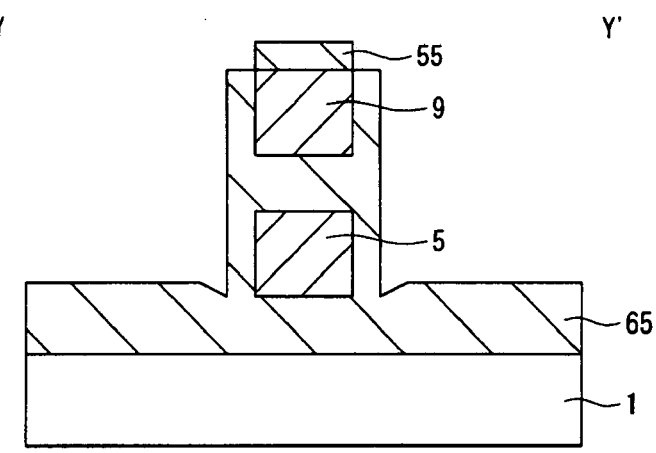
Figure 14A:
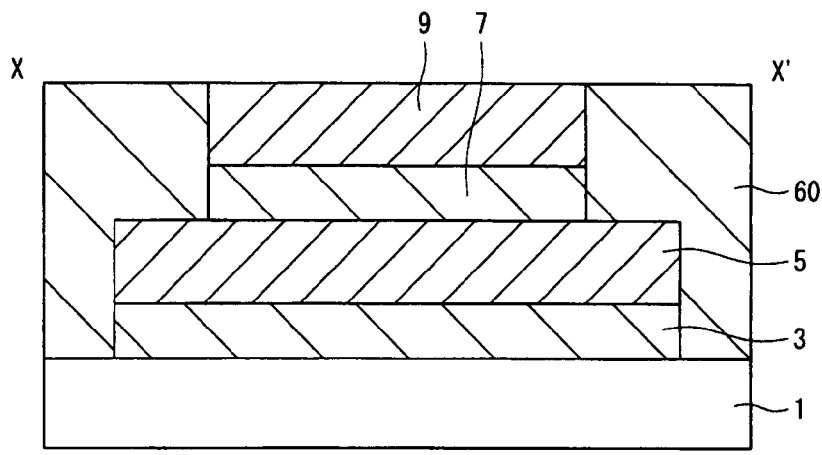
FIGS. 14A and 14B are drawings showing the method for manufacturing the non-volatile memory 100.
Figure 14B:
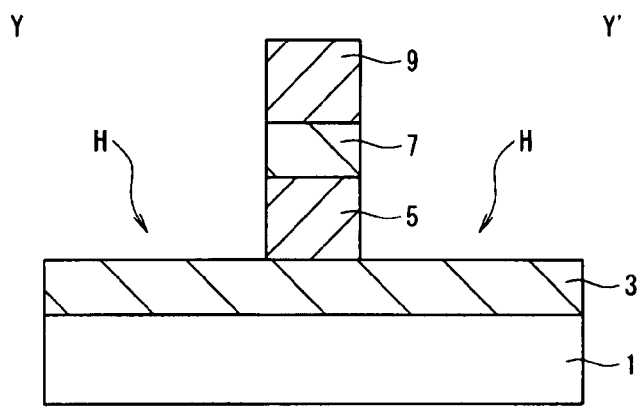

Next, the supporter 60 is etched, for example, using a dilute HF solution so that the upper surface of the SiN film 57 is exposed, and the SiN film 57 is etched, for example, using a heated phosphoric acid solution. Thus, as shown in FIGS. 13A and 13B, the $SiO_2$ film 55 on the Si layer 9 and the $SiO_2$ film 65 on the side surfaces of the Si layers 5 and 9 are exposed. Next, the $SiO_2$ films 55 and 65 are etched, for example, using a dilute HF solution. Thus, as shown in FIGS. 14A and 14B, the side surfaces of the Si layers 5 and 9 that face the groove H, and the upper surface of the Si layer 9 are exposed. Note that in FIGS. 14A and 14B and later drawings, the $SiO_2$ film 65 between the Si substrate 1 and the Si layer 5 and the $SiO_2$ film 65 between the Si layer 5 and the Si layer 9 will be referred to as the "insulating film 3" and the "insulating film 5," respectively, in order to clarify the correspondences between these drawings and FIGS. 1B and 1C.

Figure 15A:
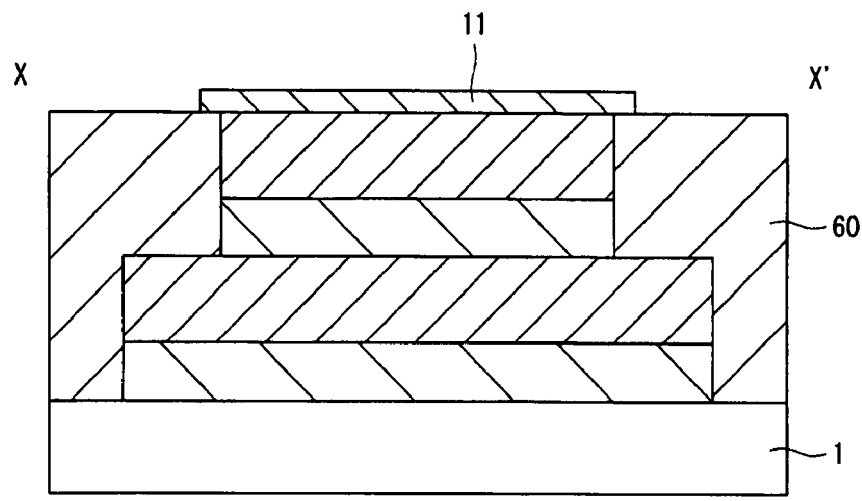
FIGS. 15A and 15B are drawings showing the method for manufacturing the non-volatile memory 100.
Figure 15B:
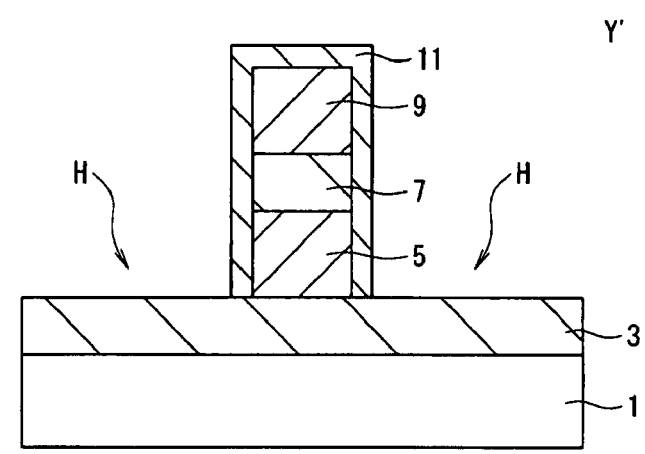

Next, as shown in FIGS. 15A and 15B, the tunnel gate insulating film 11 is formed to cover at least the side surfaces of the Si layers 5 and 9 that face groove H. Here, if the a $SiO_2$ film is used as the tunnel gate insulating film 11, the $SiO_2$ film is formed, for example, by subjecting Si to thermal oxidation or CVD. If a film whose band gap (that is, the difference in energy between the valence band and the conduction band) is smaller that that of $SiO_2$ and that has a lower energy barrier against Si is used as the tunnel gate insulating film 11, a $Si_3N_4$ film, a $Ta_2O_5$ film, a $BaTiO_3$ film, a $ZrO_2$ film, a HfO film, a $Y_2O_3$ film, a $ZrSiO_2$ film, or the like is formed, for example, by CVD or atomic layer deposition (ALD).

Figure 16A:
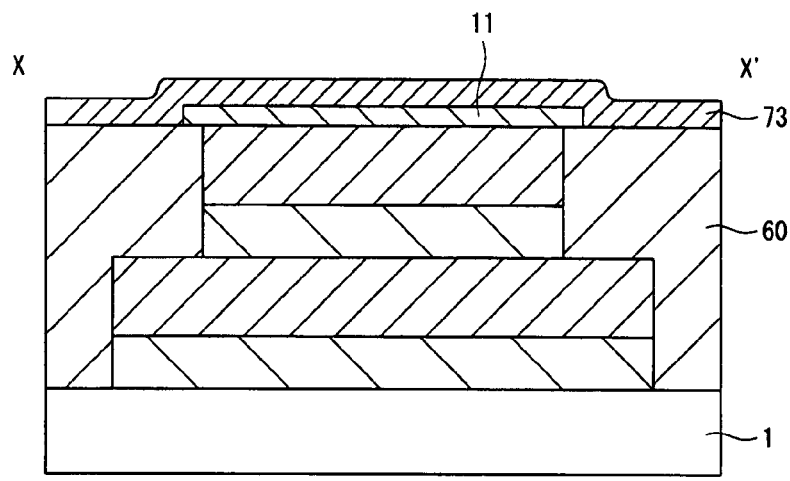
FIGS. 16A and 16B are drawings showing the method for manufacturing the non-volatile memory 100.
Figure 16B:
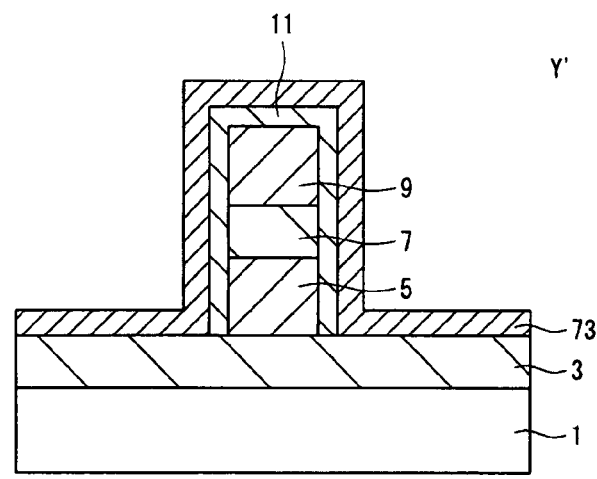

Next, as shown in FIGS. 16A and 16B, a conductive film 73 is formed entirely above the Si substrate 1 so as to cover the tunnel gate insulating film 11. For example, a semiconductor film made of poly-Si or the like or a metal film may be used as the conductive film 73. Assume here that a semiconductor film made of poly-Si is used. For example, a poly-Si film is formed by CVD.

Figure 17A:
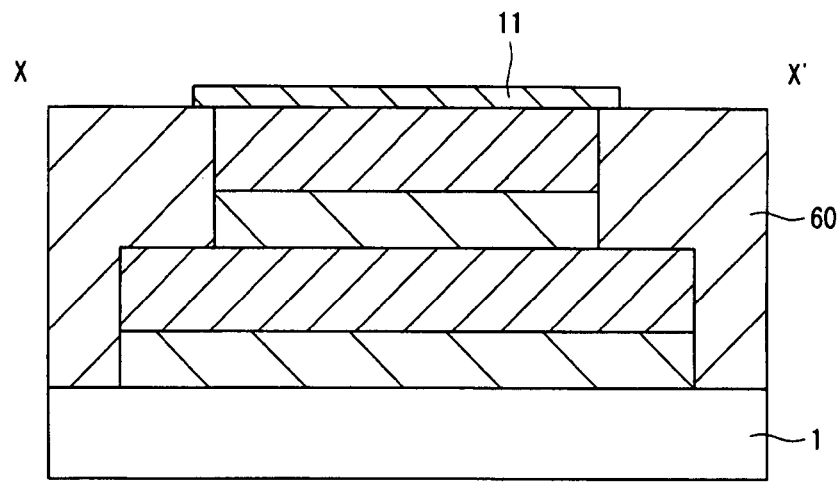
FIGS. 17A and 17B are drawings showing the method for manufacturing the non-volatile memory 100.
Figure 17B:
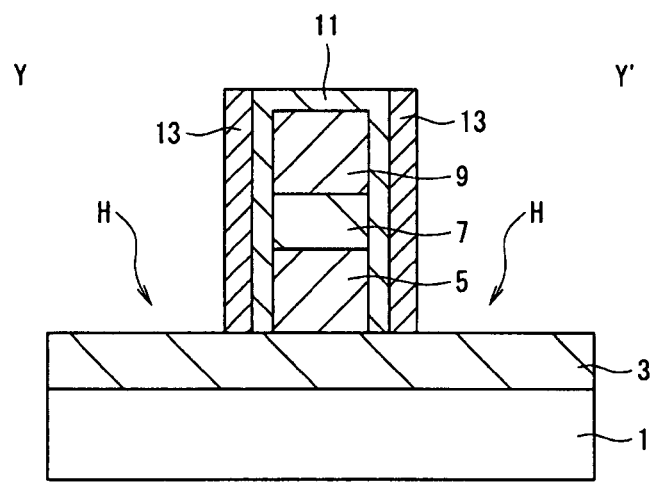
Figure 22A:
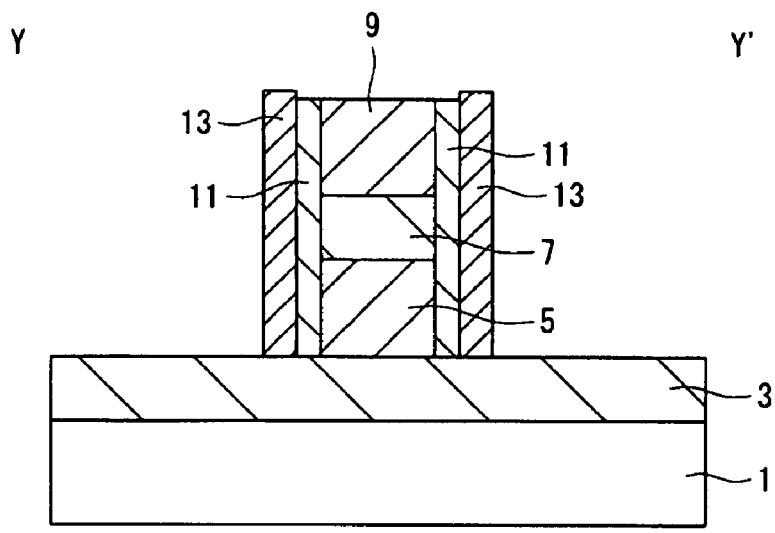
FIGS. 22A and 22B are drawings showing another example configuration of the non-volatile memory 100.

Next, the conductive film 73 is etched back using anisotropic dry etching. Thus, as shown in FIGS. 17A and 17B, the conductive film is left only on the side surfaces of the Si layers 5 and 9 that face the groove H; it is eliminated from other regions. The conductive film left on the side surfaces of the Si layers 5 and 9 that face the groove H serves as the floating gate 13. After the floating gate 13 has been formed, the surface of the floating gate 13 and the surface of the tunnel gate insulating film 11 exposed from the floating gate 13 (that is, a portion of the tunnel gate insulating film 11 left on the upper surface of the Si layer 9) is cleaned by subjecting the Si substrate 1 to cleaning, for example, using a dilute HF solution. Note that in this cleaning process, as shown in FIG. 22A, the portion of the tunnel gate insulating film 11 left on the upper surface of the Si layer 9 may be completely eliminated to expose the upper surface of the Si layer 9.

Figure 18A:
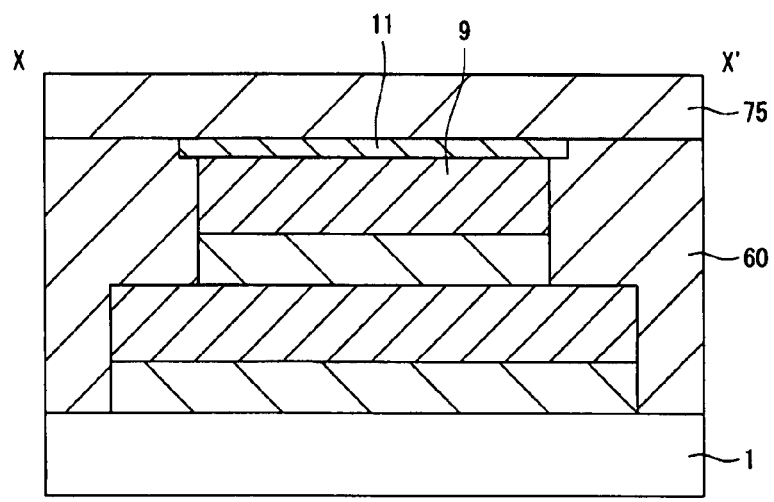
FIGS. 18A and 18B are drawings showing the method for manufacturing the non-volatile memory 100.
Figure 18B:
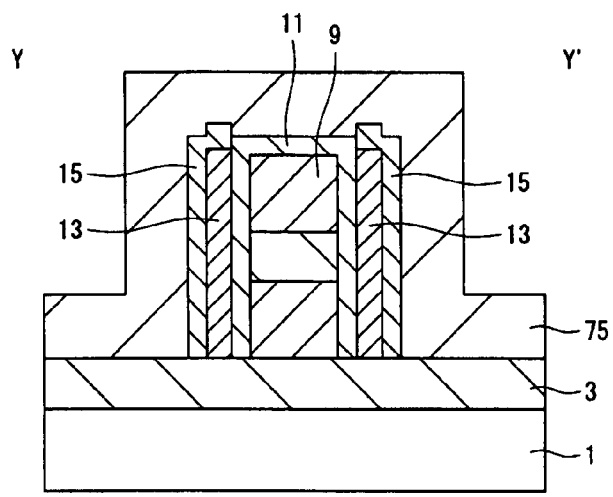
Figure 22B:
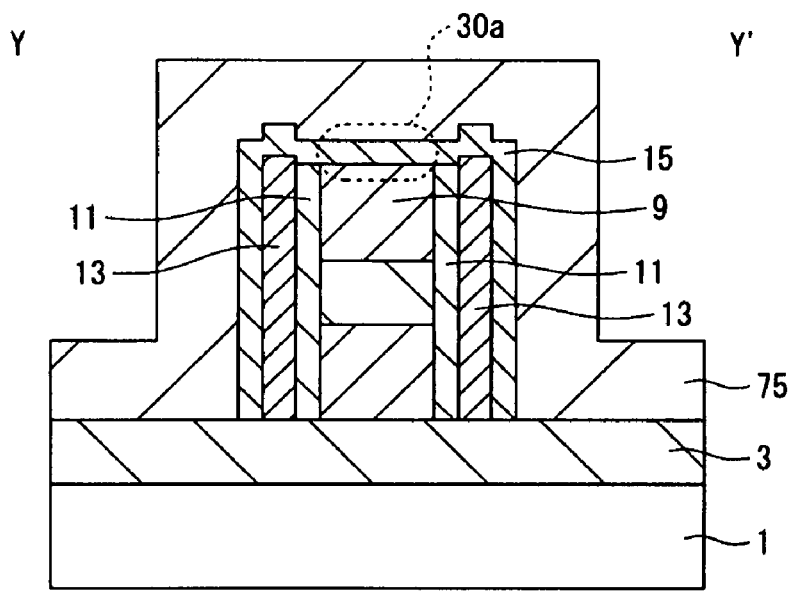

Next, as shown in FIGS. 18A and 18B, the gate insulating film 15 is formed on the floating gate 13. For example, the gate insulting film 15 is formed by thermal oxidation or high temperature oxidation (HTO; that is, thermal CVD at a high temperature of the order of 600 to 900° C.). For example, if the floating gate 13 is made of polysilicon, a $SiO_2$ film is formed by thermal oxidation. If the insulating film 11 is an oxide film made of $SiO_2$, HfO, $ZrO_2$, or the like, an oxidizing species disperses through the insulating film 11 when thermal oxidation is conducted and a new $SiO_2$ is formed on the interface between the insulating film 11 and the upper surface of the Si layer 9. Therefore, even if the insulating film 11 is formed of an oxide insulating film that has a low energy barrier, a $SiO_2$ film that has a high energy barrier exists on the upper surface of the Si layer 9. If the upper surface of the Si layer 9 is exposed in the process of fforming the gate insulating film 15, as shown in FIG. 22A, the gate insulating film 15 is also formed on the upper surface of the Si layer 9, as shown in FIG. 22B, and serves as a gate insulating layer of the NMOS 30a.

Next, as shown in FIGS. 18A and 18B, a conductive film 75 is formed entirely above the Si substrate 1 so as to cover the gate insulating film 15. Here, for example, poly-Si to which a conductive impurity such as phosphorus (P) or boron (B) is added is used as the conductive film 75.

Figure 19A:
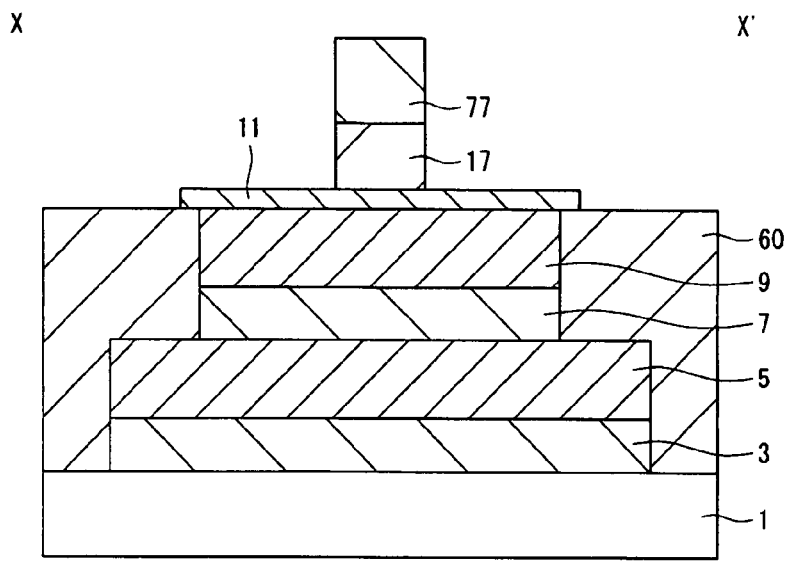
FIGS. 19A and 19B are drawings showing the method for manufacturing the non-volatile memory 100.
Figure 19B:
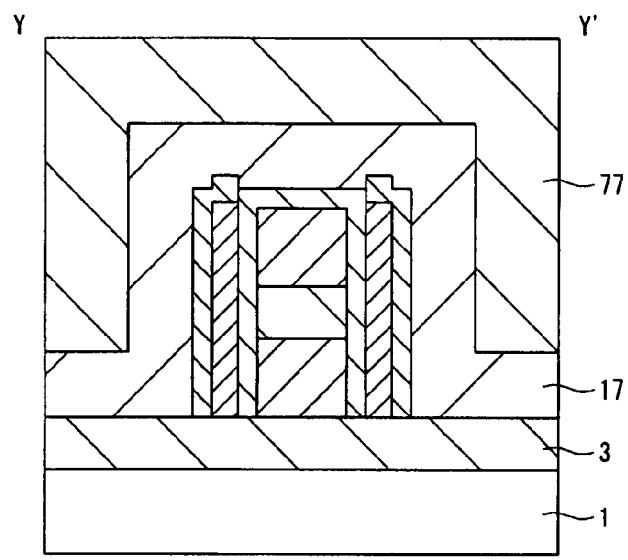

Next, as shown in FIGS. 19A and 19B, a resist pattern 77 is formed on the conductive film so as to cover a region where the control gate 17 is to be formed and to expose other regions. Then, the control gate 17 is formed by dry-etching the conductive film using the resist pattern 77 as a mask.

Figure 20A:
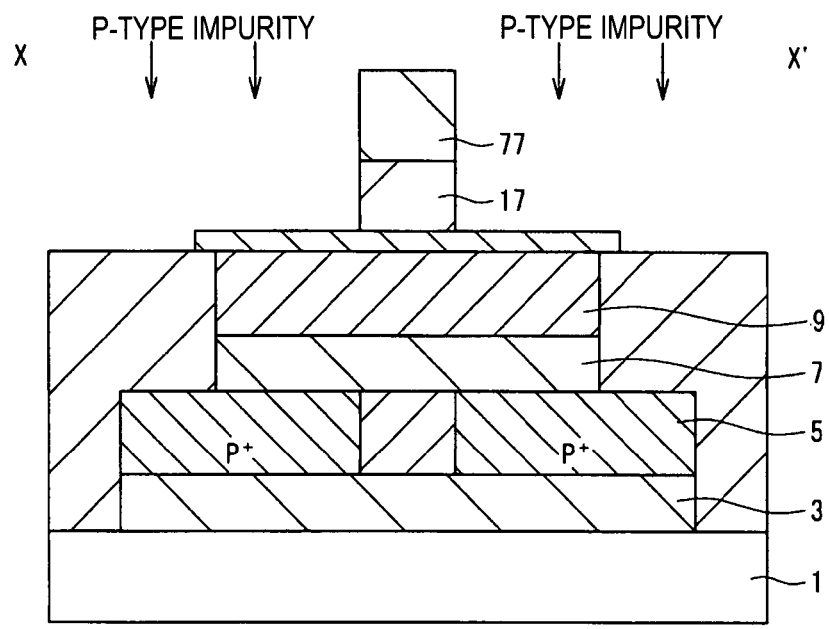
FIGS. 20A and 20B are drawings showing the method for manufacturing the non-volatile memory 100.
Figure 20B:
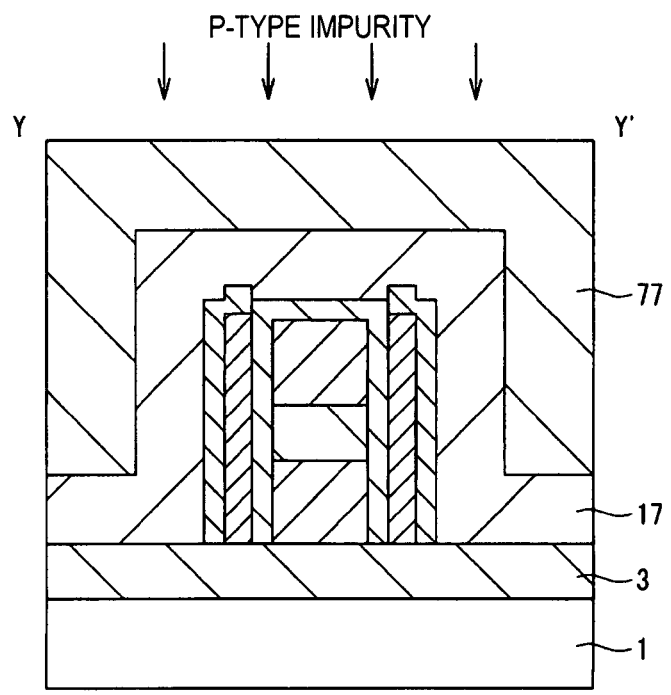

Next, as shown in FIGS. 20A and 20B, a p-type impurity such as boron is ion-implanted toward the Si substrate 1 using the resist pattern 77 and the control gate 17 as masks. Here, matching the project range (Rp) of the ion implantation with the Si layer 5 allows intensive introduction of the p-type impurity to the Si layer 5, thereby forming the source/drain (P+) of the PMOS only on the Si layer 5.

Figure 21A:
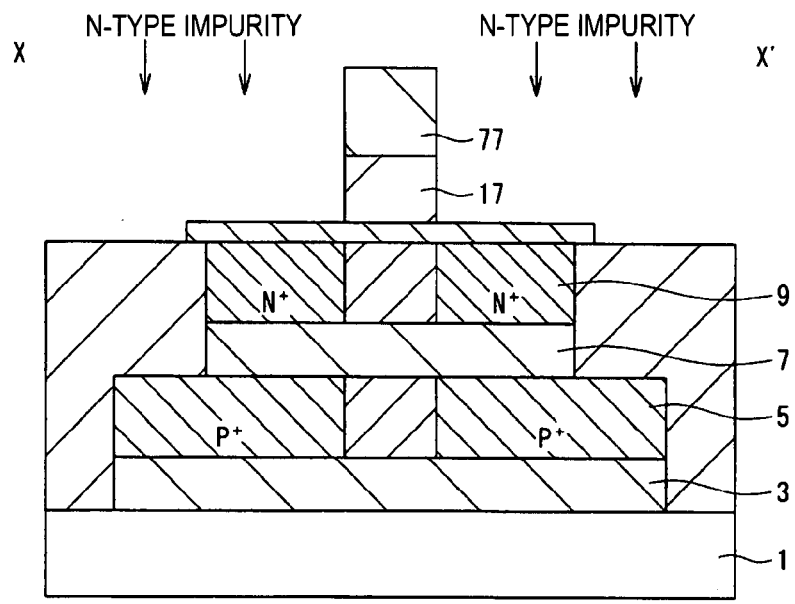
FIGS. 21A and 21B are drawings showing the method for manufacturing the non-volatile memory 100.
Figure 21B:
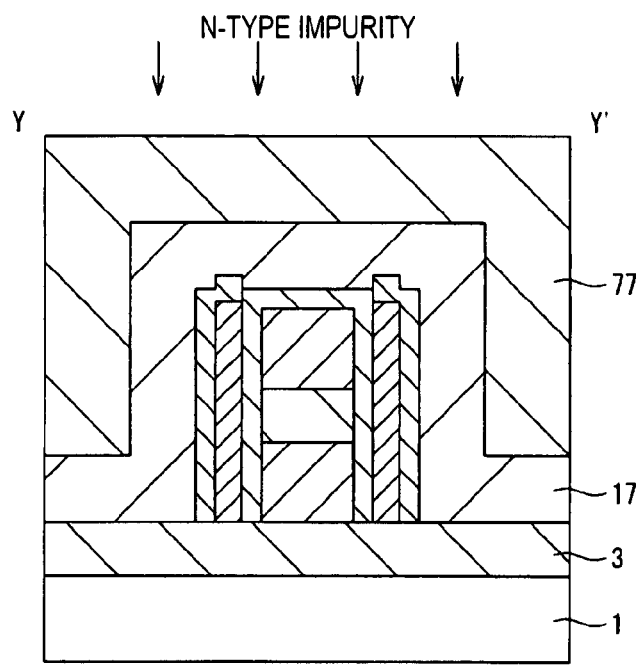

Next, as shown in FIGS. 21A and 21B, an n-type impurity such as arsenic is ion-implanted toward the Si substrate 1 using the resist pattern 77 and the control gate 17 as masks. Here, matching the Rp of the ion implantation with the Si layer 9 allows intensive introduction of the n-type impurity to the Si layer 9, thereby forming the source/drain (N+) of the NMOS only on the Si layer 9. Subsequently, the resist pattern 77 on the control gate 17 is eliminated. Thus, the non-volatile memory 100 shown in FIGS. 1A to 1C is completed.

The method described with reference to FIGS. 2A to 2B may be used to form the DiNOR circuit 200 shown in FIG. 23. In this case, it is preferable to selectively dispose the supporter hole h and groove H in multiple element separation regions (that is, regions where none of the Si layers 5 and 9 is left) 220 of the DiNOR circuit 200.

As described above, according to this embodiment, electrons are provided from the NMOS 30 to the common floating gate 13 and holes are provided from the PMOS 20 thereto. Selectively providing electrons and holes to the floating gate 13 allows changing of the potential of the floating gate 13, thereby allowing controlling the threshold voltages of the PMOS 20 and NMOS 30. For example, when data is written, electrons are provided to the common floating gate 13 so as to lower the threshold voltage of the PMOS 20 and to raise that of the NMOS 30. When data is deleted, holes are provided to the common floating gate 13 so as to recombine the stored electrons with the holes, thereby restoring the threshold voltages of the PMOS 20 and the NMOS 30 to their respective states before the data is written.

As described above, write and deletion of data is realized by providing the two types of carries, electrons and holes, to the floating gate 13. Therefore, unlike the related art examples, there is no need for applying a high, positive or negative voltage to the control gate when data is written or deleted, thereby eliminating the need for providing a high voltage drive circuit. This allows a reduction in chip area of the LSI, as well as allows write and deletion of data on a low voltage power supply using a battery, etc.

In this embodiment, the Si substrate 1 corresponds to the "substrate" or the "semiconductor substrate" according to the invention, the insulating film 2 to the "first insulating film," and the insulating film 7 to the "second insulating film." The monocrystal Si layer 5 corresponds to the "first semiconductor layer," the monocrystal Si layer 9 to the "second semiconductor layer," and the floating gate 13 to the "charge storage layer." The PMOS 20 formed on the side surfaces of the Si layer 5 corresponds to the "first conductivity type MOS transistor," and the NMOS 30 formed on the side surfaces of the Si layer 9 to the "second conductivity type MOS transistor." The SiGe layer 51 corresponds to the "first sacrifice semiconductor layer," and the SiGe layer 53 to the "second sacrifice semiconductor layer." The supporter hole h corresponds to the "first groove," and the groove H to the "second groove." The cavity 61 corresponds to the "first cavity," and the cavity 63 to the "second cavity."

In FIGS. 1A to 1C, the insulating film (that is, the gate insulating film of the NMOS 30a) on the upper surface of the Si layer 9 is preferably formed to be thicker than the tunnel gate insulating film 11 on the side surfaces of the Si layers 5 and 9. For example, as shown in FIGS. 22A and 22B, if the gate insulating film of the NMOS 30a is the gate insulting film 15, the gate insulating film 15 is preferably formed to be thicker than the tunnel gate insulating film 11. According to this feature, when electrons (or holes) are implanted to the floating gate 13, the potential barrier against carriers of the tunnel gate insulating film 11 becomes lower than that of the gate insulating film 15. Therefore, when data is written or deleted, carriers are easily moved to the floating gate 13 via the tunnel gate insulating film 11.

Also, in FIGS. 1A to 1C, with respect to an energy barrier that occurs due to contact with Si, the tunnel gate insulating film 11 on the side surfaces of the Si layers 5 and 9 is preferably formed of a material film whose energy barrier is lower than that of the gate insulating film of the NMOS 30a. For example, in FIGS. 22A and 22B, the gate insulating film 15 is preferably a $SiO_2$ film, and the tunnel gate film 11 is preferably a $Si_3N_4$ film, a $Ta_2O_6$ film, a $BaTiO_3$ film, a $ZrO_2$ film, a HfO film, a $Y_2O_3$ film, a $ZrSiO_2$ film, or the like. According to this feature, the potential barrier against carriers (electrons or holes) of the tunnel gate insulating film 11 is lower than that of the gate insulating film of the NMOS 30a. Therefore, when data is written or deleted, carriers are easily moved to the floating gate 13 via the tunnel gate insulating film 11.

Further, in FIGS. 1A to 1C, the floating gate 13 may be replaced with, a charge trap film that is an insulating film. In other words, the "charge storage layer" according to the invention is not limited to semiconductor films made of poly-Si or the like or metal films. For example, it may be insulating films such as a $Si_3N_4$ film or high resistance semiconductors such as intrinsic poly-Si. Even according to this feature, as with the above-mentioned embodiment, write and deletion of data is realized by providing the two types of carriers, electrons and holes, to the charge trap film. For example, when data is written, electrons are provided to the common charge trap film so as to change the respective threshold voltages of the PMOS 20 and NMOS 30. When data is deleted, holes are provided to the common charge trap film so as to balance the negative charge of the trapped electrons with the positive charge of the holes to restore the threshold voltages of the PMOS 20 and NMOS 30 to their respective states before the data is written. Therefore, unlike the related art examples, there is no need for applying a high, positive or negative voltage to the control gate when data is written or deleted, thereby eliminating the need for providing a high voltage drive circuit.

The entire disclosure of Japanese Patent Application No. 2006-324335, filed Nov. 30, 2006 is expressly incorporated by reference herein.

What is claimed is:

1. A semiconductor device comprising:
a substrate;
a first insulating film;
a first semiconductor layer disposed above the substrate with the first insulating film therebetween;
a second semiconductor layer disposed above the first semiconductor layer with a second insulating film therebetween;
a third insulating film disposed on at least one side surface of the first semiconductor layer and at least one side surface of the second semiconductor layer;
a floating gate disposed on the third insulating film;
a fourth insulating film disposed on the floating gate; and
a control gate disposed on the fourth insulating film,
the first semiconductor layer, the third insulating film, the floating gate, the fourth insulating film, and the control gate composing a first conductivity type metal oxide semiconductor (MOS) transistor,
the second semiconductor layer, the third insulating film, the floating gate, the fourth insulating film, and the control gate composing a second conductivity type MOS transistor, and
the fourth insulating film being not disposed on an upper surface of the second semiconductor layer.

2. The semiconductor device according to claim 1, wherein a portion of the third insulating film composing the second conductivity type MOS transistor disposed on the at least one side surface of the second semiconductor layer is thinner than a portion of the third insulating film composing the second conductivity type MOS transistor disposed on the upper surface of the second semiconductor layer.

3. The semiconductor device according to claim 1, wherein with respect to an energy barrier that occurs due to contact with the second semiconductor layer, a portion of the third insulating film composing the second conductivity type MOS transistor disposed on the at least one side surface of the second semiconductor layer is an energy barrier lower than an energy barrier of a portion of the third insulating film composing the second conductivity type MOS transistor disposed on the upper surface of the second semiconductor layer.

* * * * *